US008829410B2

(12) United States Patent
Kuboi

(10) Patent No.: US 8,829,410 B2
(45) Date of Patent: Sep. 9, 2014

(54) SOLID-STATE IMAGING DEVICE, MANUFACTURING METHOD THEREOF, AND ELECTRONIC APPARATUS

(71) Applicant: Sony Corporation, Tokyo (JP)

(72) Inventor: Nobuyuki Kuboi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/972,339

(22) Filed: Aug. 21, 2013

(65) Prior Publication Data

US 2013/0342722 A1 Dec. 26, 2013

Related U.S. Application Data

(63) Continuation of application No. 13/213,654, filed on Aug. 19, 2011, now Pat. No. 8,618,460.

(30) Foreign Application Priority Data

Aug. 26, 2010 (JP) ................................. 2010-189284

(51) Int. Cl.
*H01L 27/00* (2006.01)
*H04N 5/335* (2011.01)
*H01L 27/146* (2006.01)
*H01L 27/30* (2006.01)

(52) U.S. Cl.
CPC .............. *H01L 27/307* (2013.01); *H04N 5/335* (2013.01); *H01L 27/1464* (2013.01); *Y02E 10/549* (2013.01)
USPC ...................... 250/208.1; 250/214.1; 257/440

(58) Field of Classification Search
USPC ............. 250/208.1, 214.1; 257/40, 228, 440, 257/E27.134, E31.124; 348/272, 294, 297
See application file for complete search history.

(56) References Cited

U.S. PATENT DOCUMENTS

| 2003/0209651 | A1 | 11/2003 | Iwasaki | |
|---|---|---|---|---|
| 2005/0206767 | A1 | 9/2005 | Suzuki | |
| 2006/0263922 | A1* | 11/2006 | Levitsky et al. | 438/48 |
| 2007/0012955 | A1 | 1/2007 | Ihama | |
| 2008/0105866 | A1* | 5/2008 | Jeong et al. | 257/40 |
| 2013/0033628 | A1 | 2/2013 | Yamaguchi | |

FOREIGN PATENT DOCUMENTS

| JP | 2002-076391 | 3/2002 |
|---|---|---|
| JP | 2003-332551 | 11/2003 |
| JP | 2005-268476 | 9/2005 |
| JP | 2009088045 A * | 4/2009 |

* cited by examiner

Primary Examiner — Kevin Pyo
(74) Attorney, Agent, or Firm — Dentons US LLP

(57) ABSTRACT

A solid-state imaging device includes: pixels each including a hybrid photoelectric conversion portion and pixel transistors, wherein the hybrid photoelectric conversion portion includes a semiconductor layer having a p-n junction, a plurality of columnar or cylindrical hollow-shaped organic material layers disposed in the semiconductor layer, and a pair of electrodes disposed above and below the semiconductor layer and the organic material layers, wherein charges generated in the organic material layers through photoelectric conversion move inside the semiconductor layer so as to be guided to a charge accumulation region, and wherein the solid-state imaging device is configured as a back-illuminated type in which light is incident from a surface opposite to the surface on which the pixel transistors are formed.

11 Claims, 15 Drawing Sheets

SOLID-STATE IMAGING DEVICE, MANUFACTURING METHOD THEREOF, AND ELECTRONIC APPARATUS

RELATED APPLICATION DATA

This application is a continuation of U.S. patent application Ser. No. 13/213,654 filed Aug. 19, 2011, the entirety of which is incorporated herein by reference to the extent permitted by law. The present application claims the benefit of priority to Japanese Patent Application No. JP 2010-189284 filed on Aug. 26, 2010, in the Japan Patent Office, the entirety of which is incorporated by reference herein to the extent permitted by law.

FIELD

The present disclosure relates to a solid-state imaging device, a manufacturing method thereof, and an electronic apparatus such as a camera having the solid-state imaging device.

BACKGROUND

Solid-state imaging devices (image sensors) come in two types of a front-illuminated type and a back-illuminated type. Moreover, solid-state imaging devices in which the photoelectric conversion portion is formed of a silicon-based photodiode or an organic material layer are known.

In a solid-state imaging device having a silicon-based photodiode, the photodiode is formed of an impurity-implanted crystalline silicon layer, and incident light is subjected to photoelectric conversion whereby signal charges (for example, electrons) are extracted. Color filters for imaging visible colors are arranged on the upper layer of the photodiode. This solid-state imaging device has the following characteristics. That is, although the photoelectrically converted electrons propagate through crystalline silicon, due to the properties of silicon, the electrons have a high mobility, and the silicon is easy to process and has high mechanical strength. In addition, existing CMOS techniques can be used, and fast and stable driving is possible. The photoelectric conversion portion of CCD image sensors and CMOS image sensors commercially available on the market is mainly formed of a silicon-based photodiode.

On the other hand, in a solid-state imaging device in which an organic material layer is used as the photoelectric conversion portion, since a plurality of so-called organic photoelectric conversion films having sensitivities to respective light wavelengths are stacked so as to disperse light in a vertical direction, it is possible to disperse light without using a color filter (for example, see JP-A-2003-332551). This solid-state imaging device has the following characteristics. That is, since the organic photoelectric conversion film has a greater optical absorption coefficient than silicon, it is easy to decrease the thickness of the photoelectric conversion portion. Moreover, due to such a structure that does not use a color filter and an optical low-pass filter, the efficiency of incident light is better than the solid-state imaging device having the silicon-based photodiode. Moreover, since reception of light and color separation can be realized at the same position, the problem of false color resulting from a difference in light reception position can be obviated. Furthermore, since the organic photoelectric conversion films are flexible, it is possible to create various shapes and colors. In recent years, CMOS image sensors in which organic photoelectric conversion films are stacked have been developed (for example, see JP-A-2005-268476), which enable color imaging.

Organic photoelectric conversion films are used not only in the solid-state imaging devices but also in solar cells. A method of effectively extracting electrons generated by photoelectric conversion using an organic film made of two kinds of organic materials, for example, an organic film in which p-type crystalline microparticles are mixed into an n-type amorphous body is proposed in Japanese Patent No. 3423279, for example.

SUMMARY

In the solid-state imaging device having the silicon-based photodiode according to the related art, the absorption rate of visible light in the long wavelength region is poor due to the properties of crystalline silicon. That is, the poor absorption rate of visible light in the long wavelength region is a general property of inorganic semiconductors. The distribution of electrons (charges) generated in silicon right after photoelectric conversion was simulated when light of the colors red (wavelength: 650 nm), green (540 nm), and blue (440 nm) was incident on photodiodes of four pixels (of the colors blue, red, green, and green). According to the simulation result, the entirety of the blue light was absorbed at a silicon film thickness of 1 µm in the blue pixel, whereas 95 percent of the green and red light was absorbed at a silicon film thickness of 3 µm in the green and red pixels.

Due to such optical properties of silicon, the designed film thickness of the photodiode of a solid-state imaging device needs to be as thick as 3 µm. Thus, in the current situation, it is necessary to perform an expensive process involving high implantation energy for impurity ions implanted into photodiodes and many times of ion implantation. In particular, the manufacturing process for CMOS solid-state imaging devices involves thirty or more steps for implanting impurities into photodiodes and realizing thermal diffusion by annealing. In addition to these steps, many other steps are needed for simulation to predict optimum process conditions. Moreover, although color filters are generally needed for color imaging due to the optical properties of silicon, a light volume loss occurs due to absorption and reflection of light in the color filters. Furthermore, since the light volume loss also occurs in optical low-pass filters which are added to obviate the false color problem, the efficiency of light incident to photodiodes is generally poor.

On the other hand, in the solid-state imaging device using organic photoelectric conversion films, the mobility of electrons (charges) is generally low due to the properties of an organic film. According to recent researches, an organic film (pentacene) has been developed that realizes the mobility of electrons of up to that of amorphous silicon (for example, see Lin, Y.-Y. et al., IEEE Trans. Electron Dev. Lett. 18, 606 (1997)), which however is lower than that of crystalline silicon by one digit or more. Therefore, there is a limit in accelerating the operation speed of solid-state imaging devices which use stacked organic photoelectric conversion films. Improvement of quantization efficiency is also a great problem to be solved. Moreover, the process of forming a photoelectric conversion portion involves many thermal processing steps, which is not desirable in relation to reliability (presence of cracks or the like) of a wiring layer. Furthermore, in the current process techniques, in creating films under atmospheric pressure through roll-to-roll processing, there are problems with the adhesion and durability of the films, and mass production is not easy.

Thus, it is desirable to provide a solid-state imaging device in which at least the light absorption efficiency is increased to improve sensitivity, and the mobility of charges is increased to enable fast and stable driving and to provide a manufacturing method thereof.

It is also desirable to provide an electronic apparatus such as a camera having the solid-state imaging device.

A solid-state imaging device according to an embodiment of the present disclosure includes pixels each including a hybrid photoelectric conversion portion and pixel transistors. The hybrid photoelectric conversion portion includes a semiconductor layer having a p-n junction, a plurality of columnar or cylindrical hollow-shaped organic material layers disposed in the semiconductor layer, and a pair of electrodes disposed above and below the semiconductor layer and the organic material layers. The hybrid photoelectric conversion portion is configured so that charges generated in the organic material layers through photoelectric conversion move inside the semiconductor layer so as to be guided to a charge accumulation region. The solid-state imaging device is configured as a back-illuminated type in which light is incident from a surface opposite to the surface on which the pixel transistors are formed.

In the solid-state imaging device, the photoelectric conversion portion that constitutes the pixel is configured by a so-called hybrid photoelectric conversion portion in which photoelectric conversion is performed in the organic material layer, and charges generated in the organic material layer move inside the semiconductor layer. According to the photoelectric conversion portion, since photoelectric conversion is performed in the organic material layer, the absorption rate is improved considerably as compared to a photodiode using semiconductors. Moreover, since the generated charges move inside the semiconductor layer, the charge mobility is increased as compared to an organic photoelectric conversion portion.

A method of manufacturing a solid-state imaging device according to another embodiment of the present disclosure includes: forming a plurality of depthwise vertical holes in a semiconductor layer having a p-n junction corresponding to a pixel; and embedding an organic material layer into the vertical holes with an insulating film disposed on the bottom portions of the vertical holes. The method further includes forming a light shielding film on a rear surface of the semiconductor layer where light enters, excluding the organic material layer; and disposing a pair of electrodes with the organic material layer and the semiconductor layer disposed therebetween to thereby form a hybrid photoelectric conversion portion. Furthermore, pixel transistors constituting the pixel are disposed on the electrode disposed on a side of the semiconductor layer where no light enters with an insulating film disposed therebetween.

In the method of manufacturing the solid-state imaging device according to the embodiment of the present disclosure, the hybrid photoelectric conversion portion can be formed by forming a plurality of vertical holes in the semiconductor layer having the p-n junction, embedding an organic material layer into the vertical holes with the insulating film disposed on the bottom portions of the vertical holes, and forming the light shielding film on the rear surface of the semiconductor layer where light enters. Photoelectric conversion is performed in the organic material layer of the hybrid photoelectric conversion portion, and charges generated in the organic material layer move inside the semiconductor layer toward the charge accumulation region.

An electronic apparatus according to still another embodiment of the present disclosure includes: a solid-state imaging device; an optical system that guides incident light to a photoelectric conversion portion of the solid-state imaging device; and a signal processing circuit that processes output signals of the solid-state imaging device. The solid-state imaging device is configured by the solid-state imaging device according to the embodiment of the present disclosure.

In the electronic apparatus according to the embodiment of the present disclosure, since the electronic apparatus includes the solid-state imaging device according to the embodiment of the present disclosure, the light absorption efficiency in the photoelectric conversion portions of the pixels increases, and the charge mobility increases.

According to the solid-state imaging device of the embodiment of the present disclosure, since the light absorption efficiency in the photoelectric conversion portions of the pixels increases, it is possible to improve sensitivity. Moreover, since the charge mobility increases, it is possible to provide a solid-state imaging device in which fast and stable driving is possible.

According to the method of manufacturing the solid-state imaging device of the embodiment of the present disclosure, it is possible to manufacture a solid-state imaging device in which sensitivity is improved, and fast and stable driving is possible.

According to the electronic apparatus of the embodiment of the present disclosure, since the electronic apparatus includes the solid-state imaging device, sensitivity is improved, and fast driving is possible. Thus, it is possible to provide a high-quality electronic apparatus.

DETAILED DESCRIPTION

Hereinafter, modes for carrying out the present disclosure (hereinafter referred to as embodiments) will be described. The description will be given in the following order.

1. Simplified Exemplary Configuration of CMOS Solid-State Imaging Device
2. Basic Configuration of Pixel according to embodiment of the present disclosure (Exemplary Configuration of Pixel and Exemplary Manufacturing Method Thereof)
3. First Embodiment (Exemplary Configuration of Solid-State Imaging Device and Exemplary Manufacturing Method Thereof)
4. Second Embodiment (Exemplary Configuration of Solid-State Imaging Device and Exemplary Manufacturing Method Thereof)
5. Third Embodiment (Exemplary Configuration of Solid-State Imaging Device and Exemplary Manufacturing Method Thereof)
6. Fourth Embodiment (Exemplary Configuration of Solid-State Imaging Device and Exemplary Manufacturing Method Thereof)
7. Fifth Embodiment (Exemplary Configuration of Solid-State Imaging Device and Exemplary Manufacturing Method Thereof)
8. Sixth Embodiment (Exemplary Configuration of Solid-State Imaging Device and Exemplary Manufacturing Method Thereof)
9. Seventh Embodiment (Exemplary Configuration of Solid-State Imaging Device and Exemplary Manufacturing Method Thereof)
10. Eighth Embodiment (Exemplary Configuration of Solid-State Imaging Device)
11. Ninth Embodiment (Exemplary Configuration of Electronic Apparatus)

<1. Simplified Exemplary Configuration of CMOS Solid-State Imaging Device>

Figure 15:
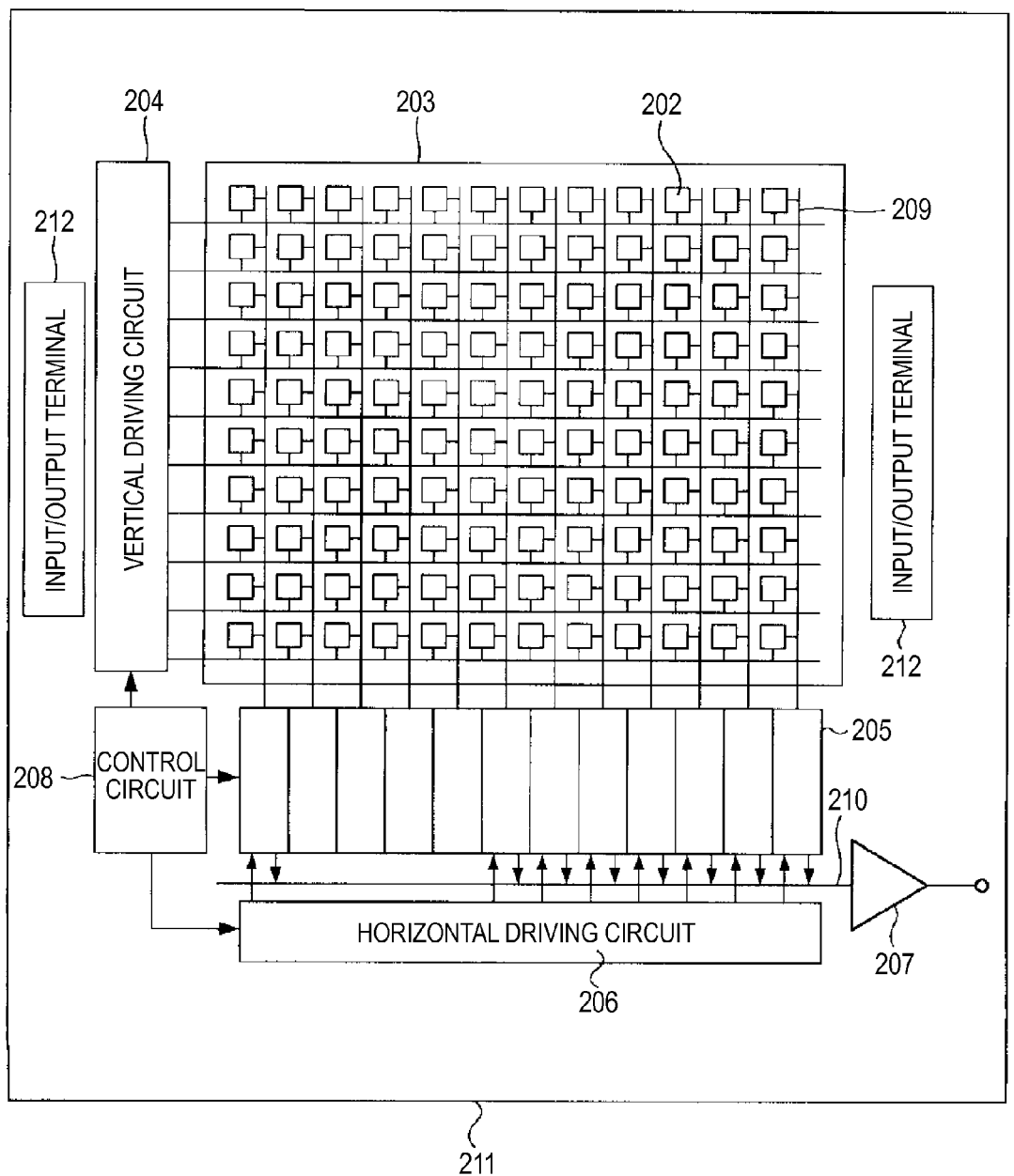
FIG. 15 is a diagram showing a simplified exemplary configuration of a CMOS solid-state imaging device applied to the respective embodiments of the present disclosure.

FIG. 15 shows a simplified exemplary configuration of a CMOS solid-state imaging device applied to respective embodiments of the present disclosure. As shown in FIG. 15, the solid-state imaging device 201 of this example is configured to include a pixel region (so-called an imaging region) 203 and a peripheral circuit portion which are provided on a semiconductor substrate 211 (e.g., a silicon substrate). The pixel portion 203 includes a plurality of pixels 202 which include a photoelectric conversion portion and which are regularly arranged in a two-dimensional array. A unit pixel made up of one photodiode and a plurality of pixel transistors can be used as the pixel 202. Moreover, a so-called pixel sharing structure in which other pixel transistors excluding a transfer transistor are shared by a plurality of photoelectric conversion portions can be used as the pixel 202. The plurality of pixel transistors may be made up of the four transistors, a transfer transistor, a reset transistor, an amplification transistor, and a select transistor or may be made up of the three transistors excluding the select transistor.

The peripheral circuit portion is configured to include so-called logical circuits, for example, a vertical driving circuit 204, column signal processing circuits 205, a horizontal driving circuit 206, an output circuit 207, a control circuit 208, and the like.

The control circuit 208 receives input clocks and data for instructing operation modes and outputs data such as the internal information of a solid-state imaging device. Specifically, the control circuit 208 generates clock signals or control signals serving as the reference signals of the operations of the vertical driving circuit 204, the column signal processing circuits 205, the horizontal driving circuit 206, and the like in accordance with a vertical synchronization signal, a horizontal synchronization signal, and a master clock. The control circuit 208 inputs these signals to the vertical driving circuit 204, the column signal processing circuits 205, the horizontal driving circuit 206, and the like.

The vertical driving circuit 204 is configured by a shift register, for example, and selects a pixel driving line and supplies pulses for driving pixels to the selected pixel driving line to thereby drive the pixels in units of rows. Specifically, the vertical driving circuit 204 selectively scans the respective pixels 202 of the pixel portion 203 sequentially in a vertical direction in units of rows. Moreover, the vertical driving circuit 204 supplies a pixel signal to the column signal processing circuit 205 through a vertical signal line 209. The pixel signal is based on signal charges generated corresponding to the amount of light received, for example, by photodiodes serving as photoelectric conversion devices of the respective pixels 202.

The column signal processing circuits 205 are provided, for example, for each column of the pixels 202 and perform signal processing such as noise removal for each pixel column on signals output from pixels 202 of one row. Specifically, the column signal processing circuits 205 perform signal processing such as CDS for removing fixed pattern noise inherent in the pixels 202, signal amplification, or AD conversion. A horizontal select switch (not shown) is connected between an output terminal of each of the column signal processing circuits 205 and a horizontal signal line 210.

The horizontal driving circuit 206 is configured by a shift register, for example, and sequentially selects each of the column signal processing circuits 205 by sequentially outputting horizontal scanning pulses and outputs the pixel signals from each of the column signal processing circuits 205 to the horizontal signal line 210.

The output circuit 207 performs signal processing on signals which are sequentially supplied from each of the column signal processing circuits 205 through the horizontal signal line 210 and outputs the processed signals. For example, the output circuit 207 may perform only buffering and may perform black level adjustment, column fluctuation correction, various digital signal processings, and the like. An input/output terminal 212 exchanges signals with an external device.

<2. Basic Configuration of Pixel According to Embodiment of the Present Disclosure>
[Exemplary Configuration of Pixel Having Hybrid Photoelectric Conversion Portion]

Figure 1A:
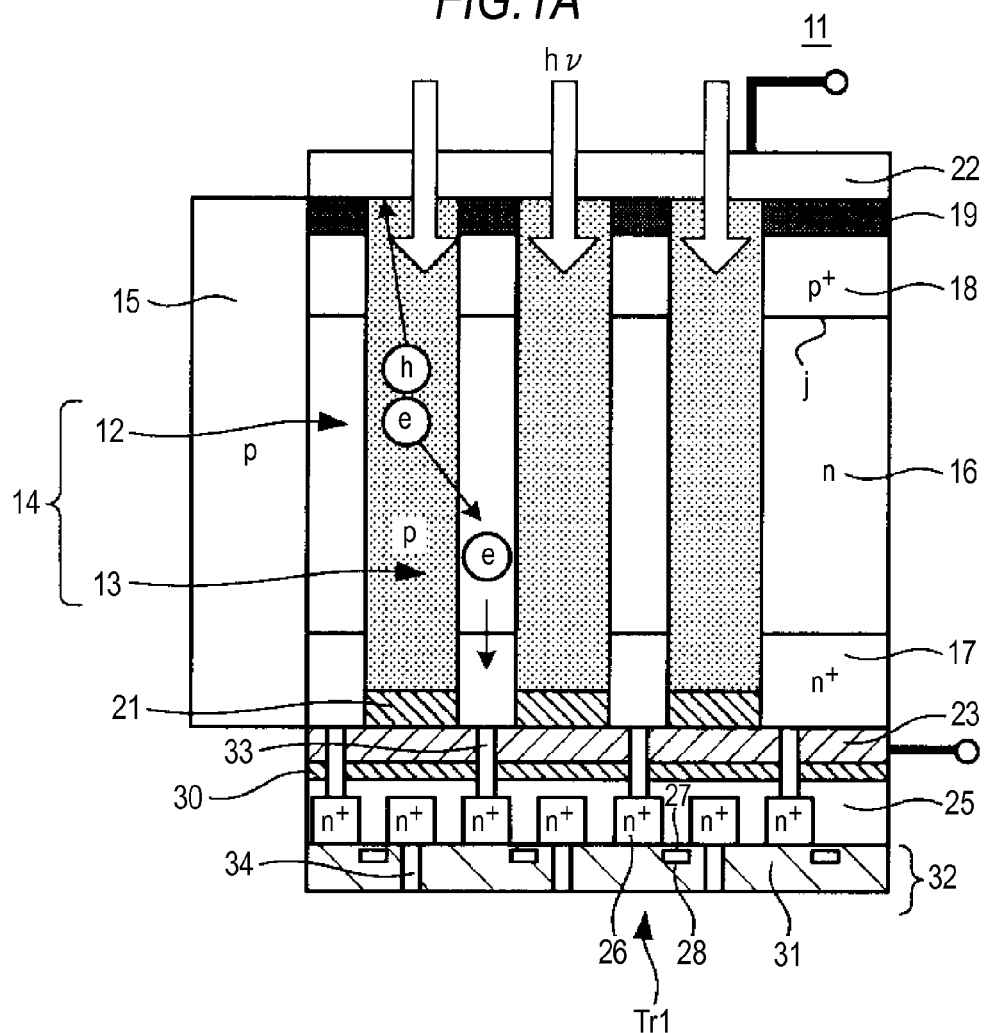
FIGS. 1A and 1B are diagrams showing a simplified exemplary basic configuration of a photoelectric conversion portion of a solid-state imaging device according to an embodiment of the present disclosure.
Figure 1B:
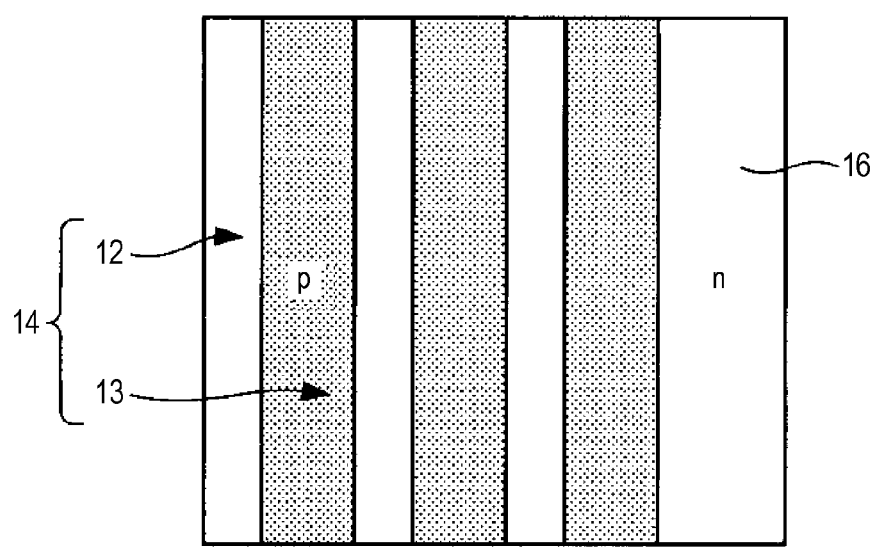

FIGS. 1A and 1B show an exemplary basic configuration of a pixel applied to a solid-state imaging device of an embodiment of the present disclosure, namely a back-illuminated type CMOS solid-state imaging device. In the drawings, in particular, the configuration of a hybrid photoelectric conversion portion made up of an organic material layer and a semiconductor layer is illustrated in an enlarged view as a photoelectric conversion portion which constitutes a pixel. As shown in FIG. 1A, a pixel 11 according to the basic configuration is configured to include a hybrid photoelectric conversion portion 14 and a plurality of pixel transistors. The hybrid photoelectric conversion portion 14 includes a semiconductor layer 12 formed of silicon and a plurality of organic material layers 13 embedded in the semiconductor layer 12. The pixel transistors are formed on the front surface side of the semiconductor layer 12. The pixel 11 is separated by an element separation region 15 formed in the semiconductor layer. In this example, the element separation region 15 is formed by a p-type semiconductor region.

The semiconductor layer 12 is thin. The semiconductor layer 12 is implanted with impurities and is configured to have a p-n junction made up of a semiconductor region 16 of first conductivity type (for example, n type), a $n^+$-type semiconductor region 17 having higher concentration than the n-type semiconductor region 16, and a semiconductor region 18 of second conductivity type (for example, $p^+$ type) having higher concentration than the n-type semiconductor region 16. The $p^+$-type semiconductor region 18 is formed on a rear surface side (the upper side in the drawing) of the semiconductor layer 12 where light enters, and the $n^+$-type semiconductor region 17 is formed on a front surface side (the lower side in the drawing) of the semiconductor layer 12 where light does not enter.

The organic material layer 13 is a region where photoelectric conversion is performed, and will be referred to as an "organic photoelectric conversion film". A plurality of organic photoelectric conversion films 13 are arranged in the semiconductor layer 12 of the pixel at necessary intervals in the plane direction and is formed in a columnar shape by being buried in a depth direction crossing from the rear surface of the semiconductor layer 12 to the vicinity of the front surface. For example, as shown in FIG. 1B, the plurality of organic photoelectric conversion films 13 are formed in a stripe shape so as to divide the semiconductor layer 12 into a plurality of parts as viewed from the upper surface. Although not shown in the drawing, the plurality of organic photoelectric conversion films 13 may be formed in a dot shape or a cylindrical hollow shape as viewed from the upper surface in order to further decrease the dependence of incident light on polarization. In this example, since signal charges are electrons, the organic photoelectric conversion film 13 is formed of a p-type organic material.

As the p-type organic material, organic compounds which have a desired absorption band and satisfy an energy band structure shown in FIG. 2A described later are used. As the p-type organic material sensitive to a visible light region, perylene-based compounds, phthalocyanine compounds, quinacridone compounds, porphyrin compounds, merocyanine compounds, and the like can be used, for example. In the embodiments described later, although the visible light region is described, by using organic compounds sensitive to terahertz rays, infrared rays, ultraviolet rays, and X rays, it is possible to perform imaging in these wavelength bands.

A light shielding film 19 is formed on a surface of the $p^+$-type semiconductor region 18 on the rear surface side of the semiconductor layer 12 so that light hv does not enter the semiconductor layer 12. The light shielding film 19 can be formed by a metal film of tungsten (W) or the like, for example. An electron blocking film 21 for blocking electrons serving as signal charges is formed on a surface of the organic photoelectric conversion film 13 where the light hv does not enter. The electron blocking film 21 is formed by an insulating film such as, for example, a silicon nitride ($Si_3N_4$) film, a silicon oxide ($SiO_2$) film, and the like.

A pair of electrodes 22 and 23 is formed on the entire rear and from surfaces of the semiconductor layer 12 including the surfaces of the light shielding film 19 and the electron blocking film 21. For the sake of convenience, the electrode 22 on the rear surface side will be referred to as an upper electrode, and the electrode 23 on the front surface side will be referred to as a lower electrode. The upper electrode 22 on the rear surface side is formed by a transparent electrode formed of a transparent conductive film that can transmit the light hv well. As the transparent conductive film, an indium tin oxide (ITO) film, a tin oxide ($SnO_2$) film, a titanium oxide ($TiO_2$) film, an indium oxide ($InO_2$) film, a conductive polymer film, and the like can be used, for example. The lower electrode 23 is formed of metal exhibiting ohmic properties. The material of the lower electrode 23 is not particularly limited as long as it is metal exhibiting ohmic properties, such as, for example, copper (Cu), aluminum (Al), and the like. As above, the light shielding film 19 is formed between the semiconductor layer 12 and the upper electrode 22, and the electron blocking film 21 is formed between the organic photoelectric conversion film 13 and the lower electrode 23.

Furthermore, a plurality of pixel transistors constituting one pixel are formed in a semiconductor region 25 formed of silicon which is disposed on the front surface side of the semiconductor layer 12, namely under the lower electrode 23 with an insulating film 30 disposed therebetween. In FIG. 1A, a transfer transistor Tr1 is illustrated as a representative of the plurality of pixel transistors. The transfer transistor Tr1 is configured to include a n-type charge accumulation region 26 for accumulating signal charges (electrons) moving in the semiconductor layer 12 described later, a floating diffusion FD formed by a n-type semiconductor region, and a transfer electrode 28 on a gate insulating film 27 disposed between the n-type charge accumulation region 26 and the floating diffusion FD.

A multilayer wiring layer 32 in which a plurality of layers of wirings (not shown) is arranged is formed on the front surface of the semiconductor region 25 with an interlayer insulating film 31 disposed therebetween. The transfer transistors Tr1 are formed so as to correspond to the respective divided semiconductor layers 12 in one pixel 11. The respective divided semiconductor layers 12 are connected to the respective corresponding n-type charge accumulation regions 26 through conductors 33 that penetrate through the lower electrode 23 in an electrically isolated state. The respective floating diffusions FD of the respective transfer transistors Tr1 are commonly connected to necessary wirings (not shown) of the multilayer wiring layer 32 through the conductors 34.

Although not shown in the drawing, an on-chip microlens is formed on the upper electrode 22 which is a transparent electrode with or without color filters disposed therebetween. The color filters are formed on the upper electrode 22 with or without an insulating film disposed therebetween.

Next, the operation of the pixel 11 of the basic configuration will be described. The pixel 11 is configured as a back-illuminated type wherein light hv enters a surface of the semiconductor layer 12 opposite to the surface where the pixel transistors are formed. A necessary voltage is applied between the upper electrode 22 and the lower electrode 23 so that the upper electrode 22 has the negative potential, and the lower electrode 23 has the positive potential. Light hv passes through the on-chip microlens to enter the p-type organic photoelectric conversion film 13, in which the light is subjected to photoelectric conversion, whereby electron-hole pairs are generated. The light hv does not enter the semiconductor layer 12 due to the light shielding film 19. Among the electron-hole pairs generated in the organic photoelectric conversion film 13, electrons e serving as signal charges move from the organic photoelectric conversion film 13 through the interface toward the semiconductor layer 12 depleted by the applied bias voltage and further move inside the depletion layer to be accumulated in the charge accumulation region 26. FIG. 2A shows an energy band structure at the interface between the p-type organic photoelectric conversion film 13 and the n-type semiconductor layer (silicon) 12. An electron e moves from the p-type organic photoelectric conversion film 13 through the interface toward the n-type semiconductor layer 12 as shown in FIGS. 1A and 2A. On the other hand, a hole h moves toward the upper electrode 22 through the organic photoelectric conversion film 13 and is discharged through the upper electrode 22.

The reason why a plurality of organic photoelectric conversion films 13 is embedded in one pixel is to decrease the average distance to the interface with the semiconductor layer 12 and increase the interface area to thereby accelerate the movement of electrons to the semiconductor layer 12 more effectively as compared to a configuration only one organic photoelectric conversion film having the same volume is embedded.

Figure 3:
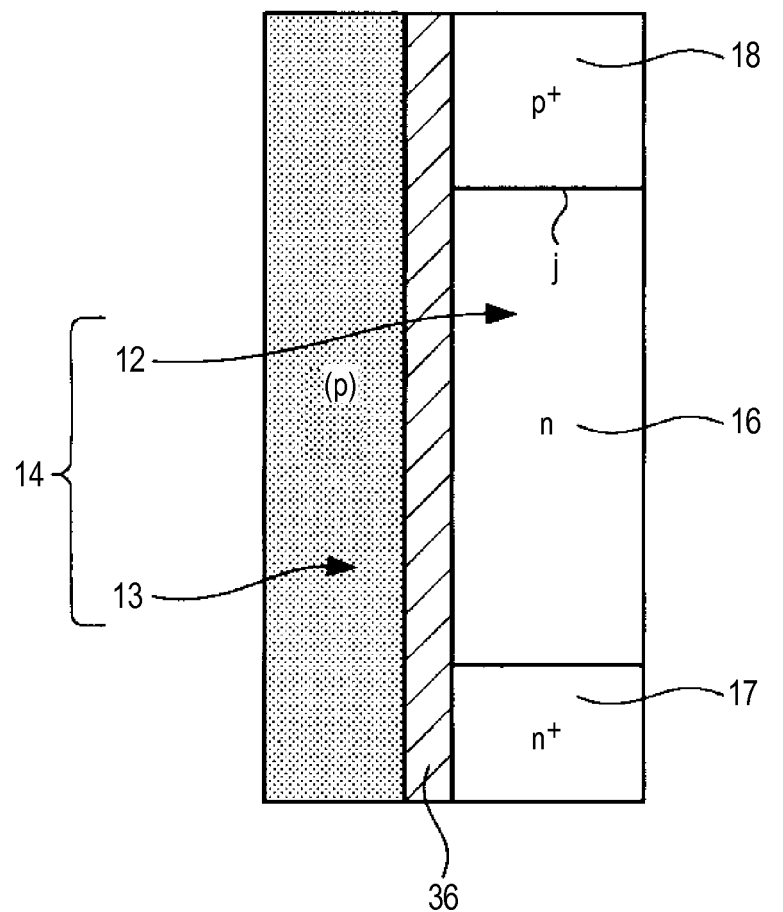
FIG. 3 is a diagram of a configuration in which a self-assembled molecule (SAM) film is formed at the interface between a semiconductor (silicon) layer and an organic photoelectric conversion film embedded therein.

The properties of a hybrid photoelectric conversion portion of the basic structure are determined by the volume occupancy of the silicon semiconductor layer 12 and the organic photoelectric conversion film 13, the organic material being used and the concentration thereof, the concentration of impurities in the semiconductor layer 12, and the state of the interface between the semiconductor layer 12 and the organic photoelectric conversion film 13. In particular, the interface state is important. In this configuration, in order to decrease the energy barrier at the interface between the silicon of the semiconductor layer 12 and the organic photoelectric conversion film 13, a self-assembled molecular (SAM) film 36 is formed at the interface between the semiconductor layer 12 and the organic photoelectric conversion film 13 as shown in FIG. 3.

The self-assembled molecular film 36 can be formed by the following method. When forming the organic photoelectric conversion film 13, a vertical hole, so-called a trench or a via, is formed in the silicon semiconductor layer 12, and an organic material is embedded in the vertical hole. When this vertical hole is formed by dry-etching, dangling bonds of silicon are generated on the lateral walls of the vertical hole. When an organic material is embedded in the vertical hole, a SAM film (Self-Assembled Molecular Film) of about one layer of atoms is formed, in which the layer of atoms is created by conjugated it bonds between the dangling bonds on the later walls and the electrons of the organic material. According to recent researches, this SAM film is known to greatly alleviate the energy barrier at the interface between general organic materials and silicon. By using this principle, it is possible to suppress the barrier at the interface and accelerate the movement of electrons from the organic photoelectric conversion film 13 toward the semiconductor layer 12.

Furthermore, as will be described in the following embodiments, by forming a concavo-convex shape, for example, of the 10 nm order on the lateral walls of the vertical hole by the Bosch process, it is possible to increase the area of the interface between the semiconductor layer 12 and the organic photoelectric conversion film 13 and to further increase the electron mobility. The Bosch process is a process for performing processing by alternately repeating an etching step using $SF_6$-based gas and a deposition step using $C_4F_8$-based gas.

[Exemplary Method of Manufacturing Pixel Having Hybrid Photoelectric Conversion Portion]

FIGS. 4A to 4F show an exemplary method of manufacturing the pixel 11 of the basic configuration having the hybrid photoelectric conversion portion. FIGS. 4A to 4F show the basic process of the pixel 11, particularly the hybrid photoelectric conversion portion. First, although not shown in the drawings, a semiconductor substrate is formed on which the semiconductor region 25 having the pixel transistors shown in FIGS. 1A and 1B, the multilayer wiring layer 32, the lower electrode 23, and the like are formed. That is, a gate electrode 28 of a pixel transistor is formed on a silicon semiconductor substrate corresponding to the semiconductor region 25, and a source/drain region is formed by ion implantation. After that, a plurality of layers of wirings is formed thereon with an interlayer insulating film disposed therebetween to thereby form the multilayer wiring layer 32, and the conductors 34 are embedded therein. Subsequently, the semiconductor substrate is made thin from the rear surface side of the semiconductor substrate to thereby form the semiconductor region 25. The substrate is reversed, and the lower electrode 23 connected to the conductors 33 penetrating through the insulating film 30 is formed on the semiconductor region 25 with the insulating film 30 disposed therebetween.

Subsequently, a silicon semiconductor substrate for pixels is bonded to the semiconductor substrate on which the semiconductor region 25, the multilayer wiring layer 32, the lower electrode 23, and the like are formed.

Figure 4A:
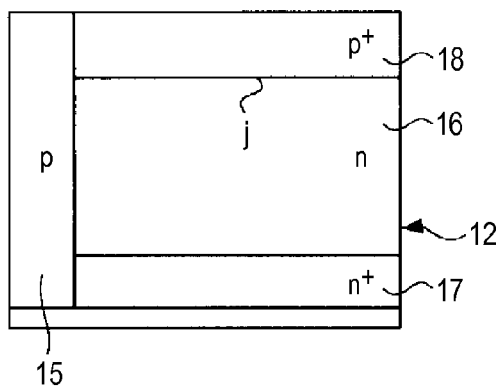
FIGS. 4A to 4F are process diagrams showing an exemplary method of manufacturing the basic configuration of the photoelectric conversion portion of the solid-state imaging device according to an embodiment of the present disclosure.

Subsequently, as shown in FIG. 4A, an element separation region 15 formed by the p-type semiconductor region is formed on the semiconductor substrate, namely the silicon semiconductor layer 12. A $n^+$-type semiconductor region 17 (corresponding to the front surface side), a n-type semiconductor region 16 (corresponding to an intermediate region), and a $p^+$-type semiconductor region 19 (corresponding to the rear surface side) are formed in that order from the lower region of the drawing in a region corresponding to one pixel divided by the element separation region 15 to thereby form a p-n junction j.

Figure 4D:
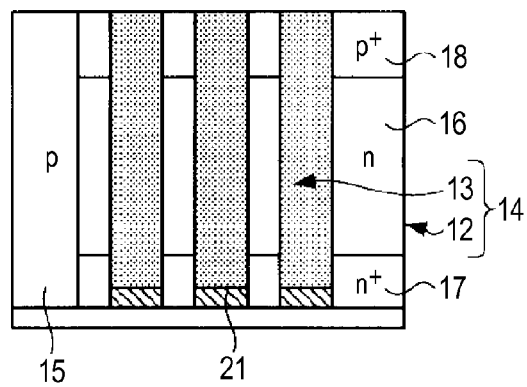
Figure 4B:
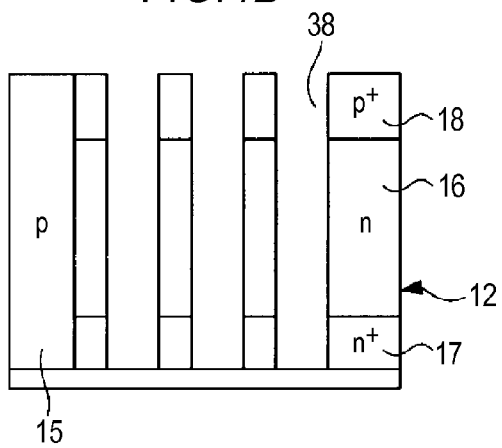

Subsequently, as shown in FIG. 4B, a vertical hole 38 such as a trench or a via extending from the $p^+$-type semiconductor region 18 to the $n^+$-type semiconductor region 17 is formed in a region of the semiconductor layer 12 corresponding to one pixel by dry-etching. A plurality of vertical holes 38 are formed at necessary intervals. In this example, as shown in FIG. 1A, the vertical holes 38 are formed in a stripe shape as seen in a planar view. In the dry-etching, $NF_3/O_2$-based gas or $SF_6/O_2$-based gas can be used, and the vertical holes 38 are formed to a thickness of about several hundreds of μm to about 1 μm. During the dry-etching, by using the Bosch process using $SF_6/C_4F_8/O_2$-based gas, it is possible to form a concavo-convex shape on the lateral walls of the vertical holes 38. By forming the concavo-convex shape, it is possible to increase the area of the interface with the organic photoelectric conversion film formed in a subsequent step and to accelerate the movement of electrons (charges).

Figure 4E:
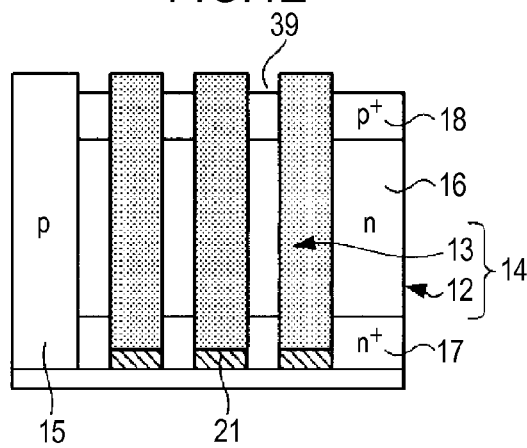
Figure 4C:
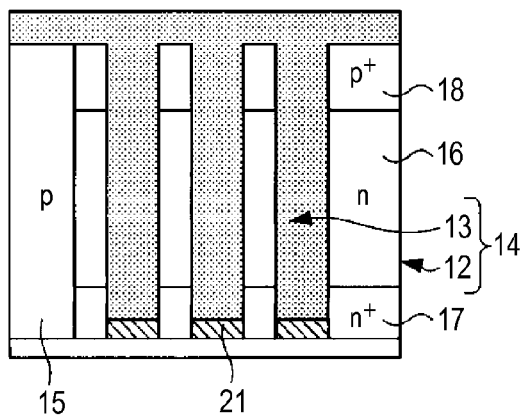

Subsequently, as shown in FIG. 4C, an electron blocking film 21 having a thickness of several tens of nm, for example is formed on the bottom portions of the vertical holes 38. The electron blocking film 21 can be formed by performing deposition by a CVD (chemical vapor deposition) method and then performing dry etch-back. For example, the electron blocking film 21 is formed by an insulating film such as, for example, a silicon nitride ($Si_3N_4$) film, a silicon nitride ($SiO_2$) film, and the like. Furthermore, an organic photoelectric conversion film 13 is deposited so as to be embedded in the vertical holes 38. The organic photoelectric conversion film 13 is formed by a p-type organic photoelectric conversion film. As a deposition method of the organic photoelectric conversion film 38, a dry deposition method or a wet deposition method can be used. Examples of the dry deposition method include a vacuum deposition method, an ion plating method, a CVD method. Examples of the wet deposition method include a spin coating method and a casting method.

Subsequently, as shown in FIG. 4D, the organic photoelectric conversion film 38 is removed by etch-back or CMP (chemical mechanical polishing) until it is flush with the surface of the $p^+$-type semiconductor region 18 of the semiconductor layer 12.

Subsequently, as shown in FIG. 4E, a resist mask (not shown) is selectively formed on the upper surfaces of the organic photoelectric conversion film 38 and the element separation region 15, and concave portions 39 are formed on the surface of the $p^+$-type semiconductor region 18 with the resist mask disposed therebetween so that the heads of the plurality of embedded organic photoelectric conversion films 38 protrudes. The concave portions 39 are formed to a depth of about several tens of nm by dry-etching.

Figure 4F:
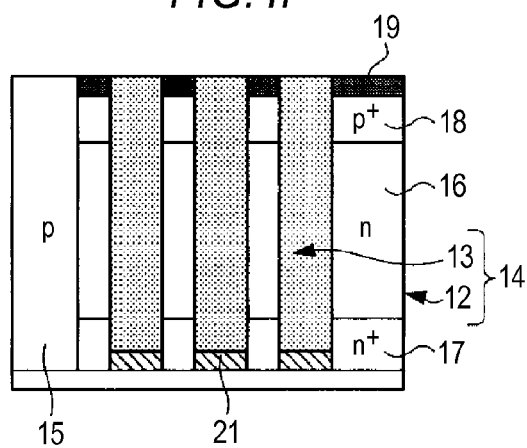

Subsequently, as shown in FIG. 4F, a light shielding film 19 is embedded in the concave portions 39 of the $p^+$-type semiconductor region 18. The light shielding film 19 can be formed by a metal film of tungsten (W) or the like, for example. That is, the light shielding film 19 is formed on the rear surface of the semiconductor layer 12 where light enters. In this way, a photoelectric conversion portion of one pixel, namely the hybrid photoelectric conversion portion 14 which includes the organic photoelectric conversion film 13 in which photoelectric conversion is performed and the semiconductor layer 12 in which electrons (charges) generated in the organic photoelectric conversion film 13 are moved toward a charge accumulation region is formed.

After that, although not shown in the drawing, a transparent electrode serving as an upper electrode is formed on the upper surface of the semiconductor layer 12, and a lower electrode is formed on the lower surface thereof. In addition, an on-chip microlens is formed on the transparent electrode with or without color filters disposed therebetween. On the other hand, pixel transistors including the transfer transistor Tr1 are formed on the semiconductor region which is disposed on the lower surface side of the lower electrode with an insulating film disposed therebetween, and a multilayer wiring layer is formed thereon. In this way, a target pixel 11 having the hybrid photoelectric conversion portion is obtained.

In addition, a pixel and logical circuit portion may be created in advance and be bonded to the semiconductor substrate on which the semiconductor region 25 having the pixel transistors, the multilayer wiring layer 32, the lower electrode 23, and the like are formed.

The back-illuminated CMOS solid-state imaging device having the pixels 11 made up of the hybrid photoelectric conversion portion 14 and the pixel transistors may be configured, for example, by bonding first and second semiconductor chips together. The hybrid photoelectric conversion portion 14 serving as a sensor portion is formed on the first semiconductor chip, and pixel transistors, peripheral circuits, and the like are formed on the second semiconductor chip. The lower electrode 23 is formed on the first semiconductor chip.

The pixel 11 described above has the hybrid photoelectric conversion portion 14 as the photoelectric conversion portion, in which photoelectric conversion is performed in the organic photoelectric conversion film 13, and electrons serving as charges generated in the organic photoelectric conversion film 13 move inside the semiconductor layer 12. Due to the presence of the hybrid photoelectric conversion portion 14, it is possible to improve the absorption rate of light in the photoelectric conversion portion, further decrease the thickness of the photoelectric conversion portion, and improve the electron mobility. That is, it is possible to improve the absorption rate of light which is a drawback of the silicon-based photodiode of the related art and decrease the thickness considerably. Moreover, it is possible to improve the electron mobility which is a drawback of the photoelectric conversion portion having the organic film of the related art. Therefore, according to the solid-state imaging device having the pixel 11, since the light absorption efficiency in the photoelectric conversion portion of the pixel increases, it is possible to improve sensitivity. Moreover, since the electron mobility is improved, it is possible to perform fast and stable driving.

For example, when the pixel 11 is applied to the stacked structure of all pixels of the colors blue, green, and red in a solid-state imaging device, color filters and optical low-pass filters are not necessary. Thus, it is possible to expect an improvement in light incidence efficiency as compared to a solid-state imaging device having the silicon-based photoelectric conversion portion. Since the hybrid photoelectric conversion portion 14 includes a semiconductor layer and an organic film, the respective problems in the silicon-based and organic film-based photoelectric conversion portions, for example, adhesion, film durability, flexibility, and processing costs can be solved. Moreover, a configuration in which electrons and holes can be separated extracted for each color is also possible. In this case, when both the electron and hole signals are used in a signal processing circuit on the subsequent stage, it is possible to further improve sensitivity.

The advantages of the solid-state imaging device having the pixel 11 will be described. In the hybrid photoelectric conversion portion 14, since photoelectric conversion is performed by the organic photoelectric conversion film 13, it is possible to improve light absorption efficiency considerably as compared to the photoelectric conversion portion using the silicon-based photodiode of the related art and to improve sensitivity per unit volume. In this way, the thickness of the photoelectric conversion portion can be decreased considerably as compared to the silicon-based photodiode. When the p-type organic photoelectric conversion film 13 is used, since electrons move in the semiconductor layer 12, it is possible to improve sensitivity and light absorption efficiency without decreasing the electron mobility as compared to the silicon-based photodiode.

During manufacturing of the photoelectric conversion portion, since the photoelectric conversion portion is thin, it is possible to decrease considerably the number of steps for impurity implantation and the number of associated steps for simulating implantation and thermal diffusion. Thus, it is possible to decrease the manufacturing cost and the TAT time in development as compared to manufacturing of the silicon-based photodiode.

The pixel 11 having the hybrid photoelectric conversion portion involves a shorter period for thermal processing steps than the pixel having the organic photoelectric conversion film-based photoelectric conversion portion. Thus, it is possible to improve reliability of the wirings of the multilayer wiring layer. That is, since the volume of the formed organic photoelectric conversion film is smaller than the organic photoelectric conversion film-based photoelectric conversion portion which is entirely formed of the organic photoelectric conversion film, the period for the thermal processing steps can be decreased.

[Another Exemplary Basic Configuration of Pixel Having Hybrid Photoelectric Conversion Portion]

Figure 5A:
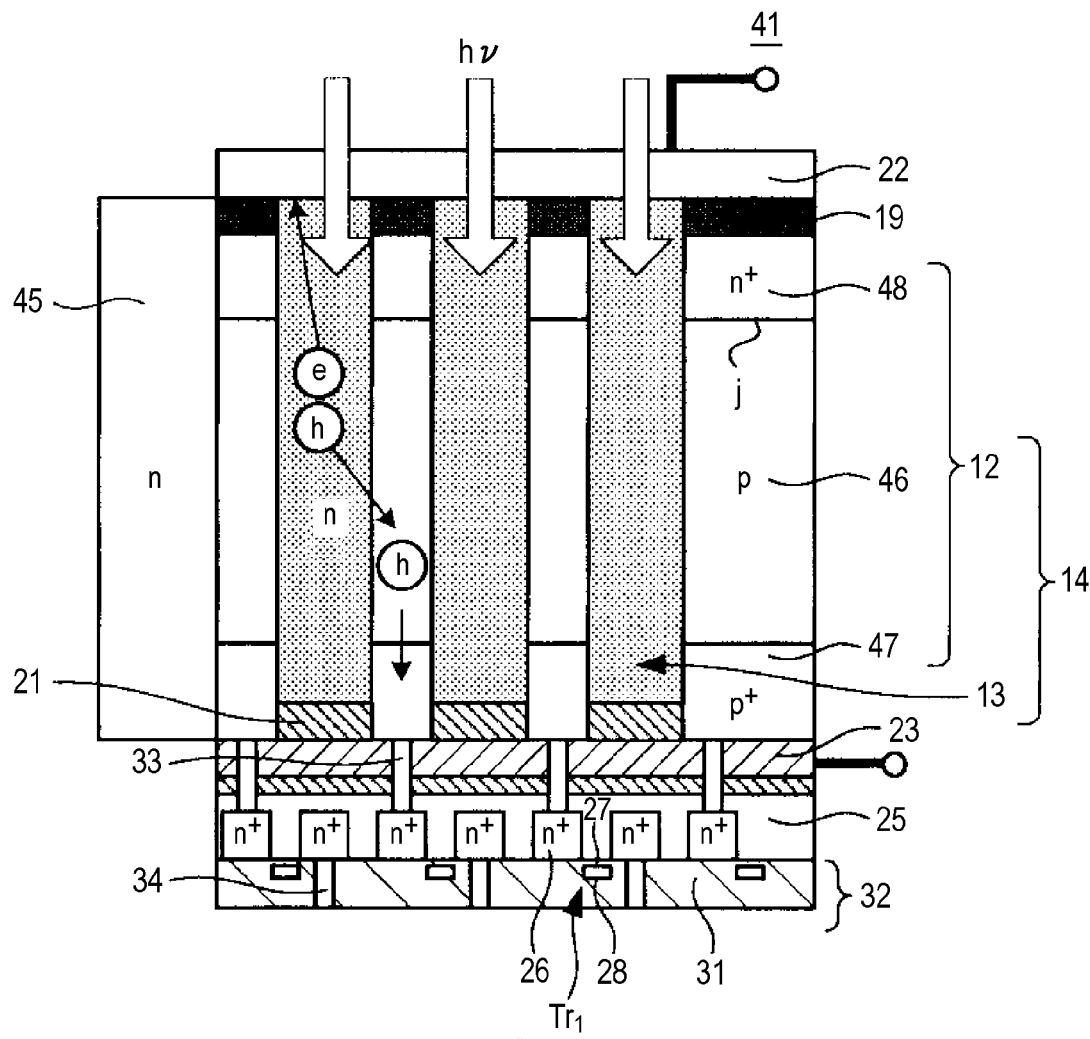
FIGS. 5A and 5B are diagrams showing another simplified exemplary basic configuration of the photoelectric conversion portion of the solid-state imaging device according to an embodiment of the present disclosure.
Figure 5B:
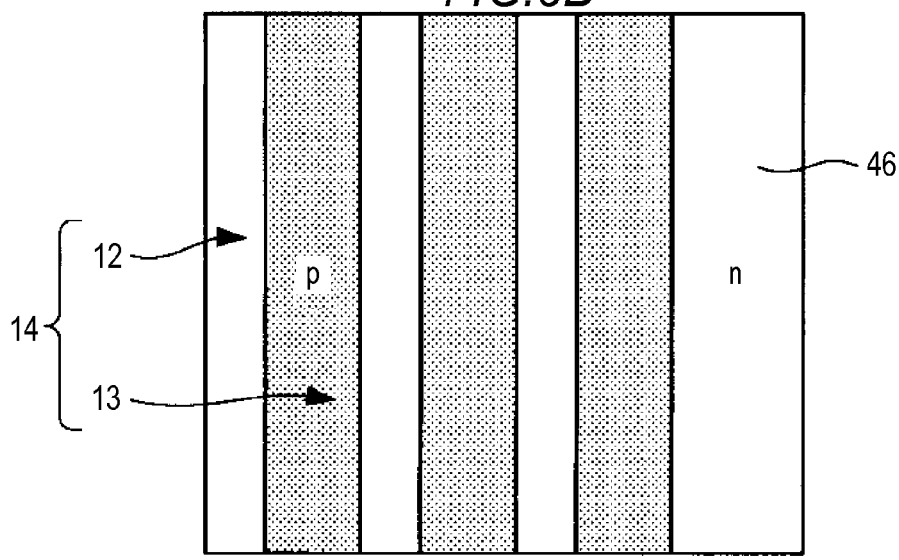

FIGS. 5A and 5B show another exemplary basic configuration of a pixel applied to a solid-state imaging device according to an embodiment of the present disclosure, namely a back-illuminated CMOS solid-state imaging device. Although electrons e are used as signal charges in FIGS. 1A and 1B, in this example, holes h are used as signal charges. A pixel 41 according to this basic configuration is configured to include a hybrid photoelectric conversion portion in one pixel, in which a plurality of organic photoelectric conversion films 13 is embedded in the semiconductor layer 12 as described above. However, the conductivity types of the respective semiconductor regions and organic photoelectric conversion films 13 of the semiconductor layer 12 constituting the pixel 41 are opposite to the conductivity types of the semiconductor regions and organic photoelectric conversion films of the pixel 11 described above. That is, the element separation region is formed by an n-type semiconductor region 45. The semiconductor layer 12 constituting the photoelectric conversion portion 14 includes an $n^+$-type semiconductor region 48, a p-type semiconductor region 46, and a $p^+$-type semiconductor region 47 which are formed in that order from top to bottom in FIGS. 5A and 5B. The organic photoelectric conversion film 13 is formed by an n-type organic material. As the n-type organic material, organic materials such as, for example, naphthalene-based compounds, perylene-based compounds, and C60 can be used. On the other hand, the source/drain region including the floating diffusions FD constituting the pixel transistors is formed by a p-type semiconductor region.

The other configurations are the same as those described with reference to FIGS. 1A and 1B and FIG. 3. Thus, portions in FIGS. 5A and 5B corresponding to those of FIGS. 1A and 1B will be denoted by the same reference numerals, and redundant description thereof will be omitted.

Next, the operation of the pixel 41 will be described. A necessary bias voltage is applied between the upper electrode 22 and the lower electrode 23 so that the upper electrode 22 has the positive potential, and the lower electrode 23 has the negative potential. Light hv passes through the on-chip microlens to enter the n-type organic photoelectric conversion film 13, in which the light is subjected to photoelectric conversion, whereby electron-hole pairs are generated. The light hv does not enter the semiconductor layer 12 due to the light shielding film 19. Among the electron-hole pairs generated in the organic photoelectric conversion film 13, holes h serving as signal charges move from the organic photoelectric conversion film 13 through the interface toward the semiconductor layer 12 depleted by the applied bias voltage and further move inside the depletion layer to be accumulated in the charge accumulation region 26. FIG. 2B shows an energy band structure at the interface between the n-type organic photoelectric conversion film 13 and the p-type semiconductor layer (silicon) 12. A hole h moves from the n-type organic photoelectric conversion film 13 through the interface toward the p-type semiconductor layer 12 as shown in FIGS. 5A and 5B and FIG. 2B. On the other hand, an electron e moves toward the upper electrode 22 through the organic photoelectric conversion film 13 and is discharged through the upper electrode 22.

In the pixel 41 described above, since the photoelectric conversion portion is configured by the hybrid photoelectric conversion portion 14, it is possible to improve light incidence efficiency and to improve hole mobility similarly to the pixel 11. Since holes move inside a material having good crystallinity, the hole mobility is also improved similarly to the electron mobility. Therefore, in a solid-state imaging device having the pixel 41, it is possible to realize high-sensitivity and fast driving.

From the perspective of electron mobility, in a solid-state imaging device that requires a fast operation, the configuration of the pixel 11 shown in FIGS. 1A and 1B is preferable as compared to the configuration of the pixel 41 shown in FIGS. 5A and 5B in which holes h are used as signal charges.

<3. First Embodiment>

[Exemplary Configuration of Solid-State Imaging Device]

Figure 6A:
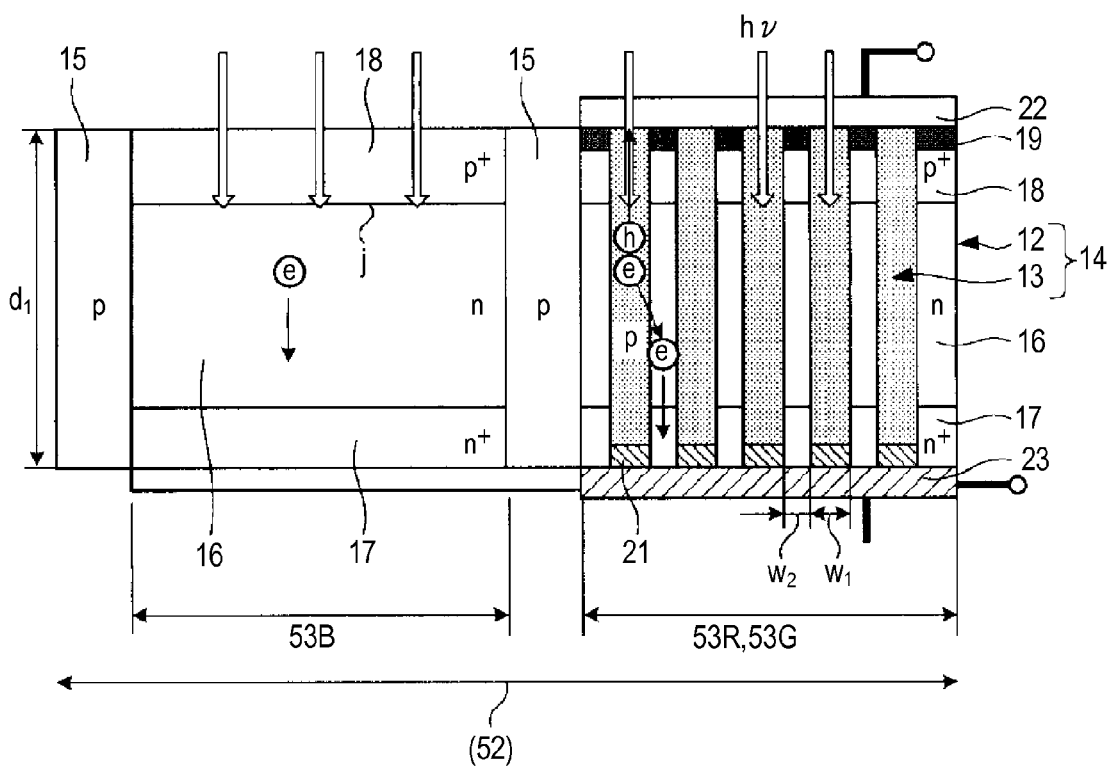
FIGS. 6A and 6B are diagrams showing a simplified configuration of a main part of a solid-state imaging device according to a first embodiment of the present disclosure.
Figure 6B:
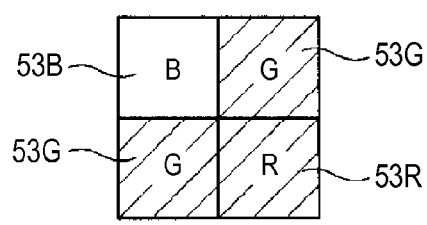

FIGS. 6A and 6B show a solid-state imaging device according to a first embodiment of the present disclosure, namely a back-illuminated CMOS solid-state imaging device. A solid-state imaging device 51 according to the first embodiment is configured to include primary color filters having the Bayer arrangement and a pixel region 52 in which a group of pixels made up of a blue (B) pixel 53B, a red (R) pixel 53R, a green (G) pixel 53G, and a green (G) pixel 53G are arranged in a two-dimensional array as shown in FIG. 6B. Moreover, the blue pixel 53B is formed by a photoelectric conversion portion which is formed of a photodiode PD formed in a silicon semiconductor region, and the red pixel 53R, the green pixel 53G, and the green pixel 53G are formed by the hybrid photoelectric conversion portion 14 shown in FIGS. 1A and 1B.

That is, in the present embodiment, the thin single-crystal-line silicon semiconductor layer 12 is divided into respective pixels by an element separation region 15 which is formed by a p-type semiconductor region. In the blue pixel 53B, a $p^+$-type semiconductor region 18, an n-type semiconductor region 16, and a $n^+$-type semiconductor region 17 are formed in that order from the light incident surface of the semiconductor layer 12 toward the opposite surface, and a photoelectric conversion portion formed of a photodiode PD having a p-n junction j is formed. In the red pixel 53R and the two green pixels 53G, the same $p^+$-type semiconductor region 18, n-type semiconductor region 16, and $n^+$-type semiconductor region 17 are formed, and a hybrid photoelectric conversion portion 14 in which a plurality of p-type organic photoelectric conversion films 13 are embedded in the semiconductor layer 12 having a p-n junction j is formed. Moreover, in the hybrid photoelectric conversion portion 14, a light shielding film 19 is formed on the light incident surface of the $p^+$-type semiconductor region 18, and an electron blocking film 21 is formed on the surface of the photoelectric conversion portion 13 opposite to the light incident surface. Although not shown in the drawings, an insulating film is formed between the light shielding film 19 formed of a metal film, for example, and the organic photoelectric conversion film 13.

As the organic photoelectric conversion film 13 in the red pixel 53R which is sensitive to red wavelength band, organic materials such as, for example, phthalocyanine compounds, porphyrin compounds, and merocyanine compounds can be used. As the organic photoelectric conversion film 13 in the green pixel 53G which is sensitive to green wavelength band, organic materials such as, for example, quinacridone compounds and porphyrin compounds can be used. However, the kinds of organic materials are not particularly limited as long as the organic materials are organic compounds which have a higher light absorption coefficient than crystalline silicon and which have an energy band structure with respect to silicon as shown in FIG. 2A.

A pair of an upper electrode 22 and a lower electrode 23 is formed above and below the photoelectric conversion portion 14. The upper electrode 22 on the light incident side is formed of a transparent electrode. Although not shown in FIGS. 6A and 6B, color filters and on-chip microlenses are formed on the upper electrode 22. Moreover, a semiconductor substrate in which pixel transistors are formed is disposed below the lower electrode 23 with an insulating film disposed therebetween, and a multilayer wiring layer having a plurality of layers of wirings is disposed thereon with an interlayer insulating film disposed therebetween.

In the present embodiment, one pixel has an area of 1.4 μm by 1.4 μm. The thickness d1 of the semiconductor layer 12 is set to about 1 μm so that the entirety of light entering the red pixel 53B can be absorbed. Five organic photoelectric conversion films 13 are disposed in the semiconductor layer 12, and the width w1 thereof is typically set to about 200 nm. If the width w1 of the organic photoelectric conversion film is too small, interaction with light may not occur. The width w2 of the semiconductor layer 12 in which electrons move is set to about 50 nm.

[Exemplary Method of Manufacturing Solid-State Imaging Device]

The processes of manufacturing the red and green pixels in the solid-state imaging device 51 of the first embodiment are the same as those illustrated in FIGS. 4A to 4F. The conditions when forming the vertical holes 38 will be described. In this example, an example of the dry-etching conditions using a CCP (Capacitive Coupled Plasma) etching apparatus will be described below. In addition, the processing conditions and other apparatuses used other than the CCP etching apparatus are not particularly limited. The other apparatuses used refer to apparatuses such as an IPC (Inductive Coupled Plasma) apparatus or an ECR (Electron Cyclotron Resonance) apparatus.

---

Gas Type and Flow Rate: $NF_3/O_2/HBr$ = 40/15/200 sccm
Pressure: 100 mT
Upper Application Power: 700 W
Lower Application Power: 400 W
Etching Time: 60 sec
RF Frequency: Upper/Lower = 40 MHz/3 MHz

---

Here, the upper and lower refer to the upper electrode and lower electrode of an etching apparatus. The RF frequency defines the frequency of a bias voltage applied to the upper electrode and the frequency of a bias voltage applied to the lower electrode.

The baking temperature during forming of the organic photoelectric conversion film 13 was typically in the range of 80 and 150° C. although it depends on a solvent. The upper electrode 22 was an ITO (Indium Tin Oxide) film and is deposited on a transparent glass substrate to a thickness of about 30 nm. The lower electrode 23 was a metal electrode having a thickness of about 30 nm, and is preferably formed of metal having a low ohmic resistance to silicon, for example, such as an alloy of indium, copper, aluminum, and magnesium. The electron blocking film 21 was formed of a silicon oxide (SiO) film having a thickness of 10 nm. The light shielding film 19 was formed of a tungsten (W) film. The etch-back of the electron blocking film 21 was performed under conditions such that the etching selectivity to silicon was high.

Such conditions are as follows, for example.
Gas Type and Flow Rate: $C_4F_8/O_2/Ar$=30/400/15 sccm
Pressure: 30 mT According to the solid-state imaging device 51 according to the first embodiment, the photoelectric conversion portion of the blue pixel 53B is configured by the silicon-based photodiode PD, and the photoelectric conversion portions of the red and green pixels 53R and 53G are configured by the hybrid photoelectric conversion portion 14. In the red and green pixels 53R and 53G, since photoelectric conversion is performed by the organic photoelectric conversion film 13, it is possible to improve light absorption efficiency considerably and improve the sensitivities of the red and green pixels 53R and 53G. Moreover, in the red and green pixels 53R and 53G, since electrons generated in the organic photoelectric conversion film 13 move inside the silicon semiconductor layer 12, it is possible to increase electron mobility and perform fast and stable driving. That is, it is possible to improve sensitivity and light absorption efficiency without decreasing electron mobility. On the other hand, since the thickness d1 of the semiconductor layer 12 can be set to a thickness so that the entirety of blue incident light can be absorbed, it is possible to decrease the thicknesses of the photoelectric conversion portions of all pixels. In addition, the thickness of the photoelectric conversion portion configured by only the silicon-based photodiode is about 3 μm, whereas in the first embodiment, the thickness of the photoelectric conversion portion of an entire pixel is decreased to about 1 μm.

In the present embodiment, since the volume of the embedded organic photoelectric conversion film is smaller than that of the CMOS solid-state imaging device having the organic photoelectric conversion film-based photoelectric conversion portion, it is possible to shorten the period for thermal processing steps. Thus, it is possible to suppress damage to the wirings of the multilayer wiring layer to thereby improve reliability of the wirings. Moreover, in the present embodiment, since the hybrid photoelectric conversion portion 14 is made up of the silicon semiconductor layer 12 and the organic photoelectric conversion film 13, the respective problems in the silicon-based and organic film-based photoelectric conversion portions, for example, adhesion, film durability, flexibility, and processing costs can be solved.

<4. Second Embodiment>
[Solid-State Imaging Device and Exemplary Manufacturing Method Thereof]

FIGS. 7A to 7F show a solid-state imaging device according to a second embodiment of the present disclosure, namely a back-illuminated CMOS solid-state imaging device, and a manufacturing method thereof. The solid-state imaging device of the second embodiment has the same basic configuration as the first embodiment, except for the configuration of the hybrid photoelectric conversion portion. FIGS. 7A to 7F show an exemplary method of manufacturing a solid-state imaging device, in particular, an exemplary method of forming the hybrid photoelectric conversion portion 14, and other configurations are omitted.

Figure 7A:
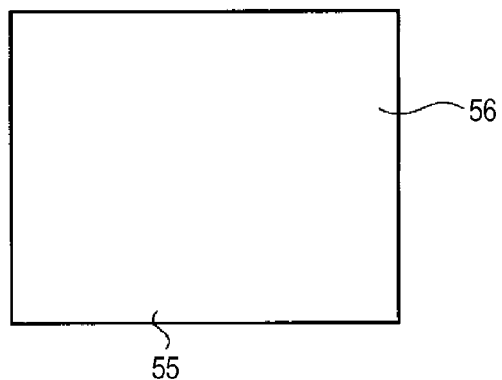
FIGS. 7A to 7F are process diagrams showing a simplified configuration of a main part of a solid-state imaging device according to a second embodiment of the present disclosure and an exemplary manufacturing method thereof.

First, as shown in FIG. 7A, a polysilicon layer 56 is formed on a silicon semiconductor substrate 55 to a thickness of about 1 μm by a low-temperature CVD method.

Figure 7D:
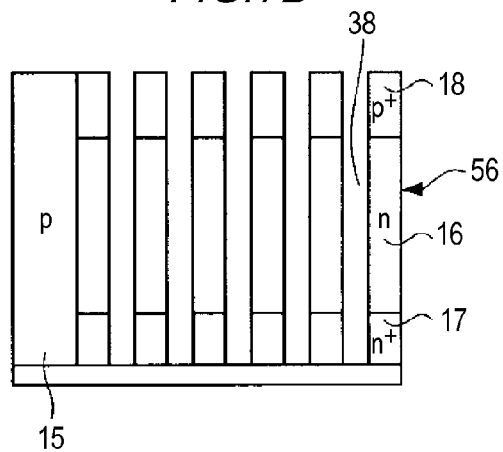
Figure 7B:
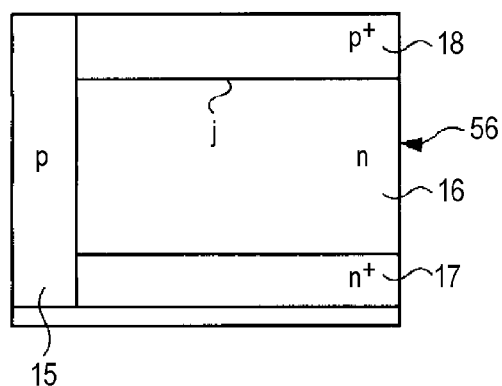

Subsequently, as shown in FIG. 7B, p-type impurities are ion-implanted into the polysilicon layer 56 to thereby an element separation region 15 which is formed of a p-type semiconductor region. Moreover, n-type and p-type impurities are ion-implanted into the polysilicon layer 56 serving as a semiconductor layer corresponding to the respective pixels divided by the element separation region 15, whereby an n+-type semiconductor region 17, an n-type semiconductor region 16, and a p+-type semiconductor region 18 are formed.

Figure 7E:
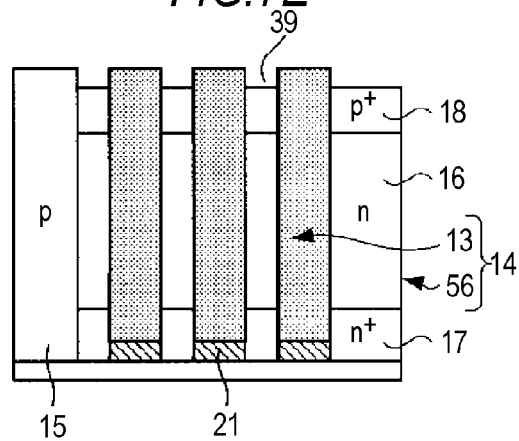
Figure 7C:
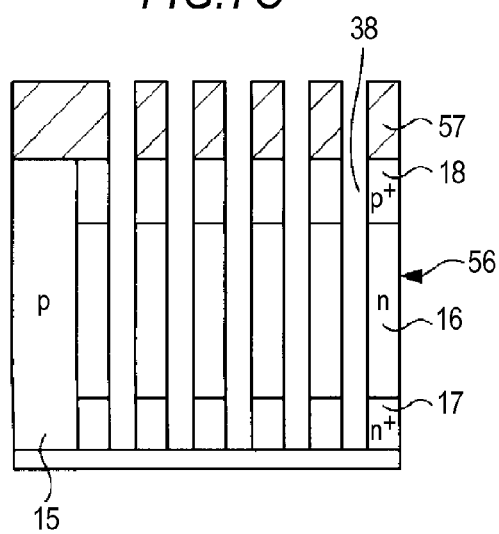
Figure 7F:
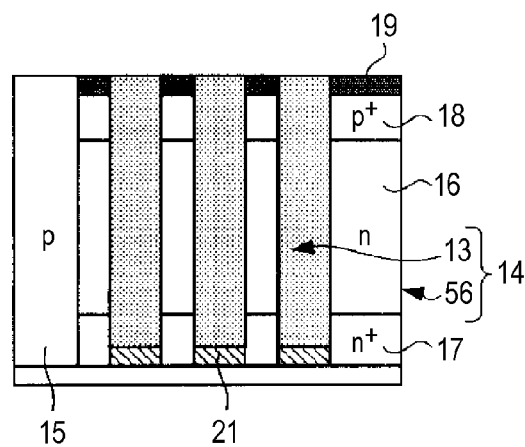

Subsequently, as shown in FIG. 7C, five vertical holes 38 are formed in the polysilicon layer 56 corresponding to the red and green pixels by dry-etching with a resist mask 57 having a thickness of about 500 nm disposed therebetween. By the etching of the polysilicon layer 56, the surfaces of crystalline silicon particles approach the walls of the vertical holes 38. The walls of the vertical holes in which the surfaces of the crystalline particles approach have a concavo-convex shape.

Subsequently, as shown in FIG. 7D, the resist mask 57 is removed by ashing and washing treatments.

Subsequently, through the same steps as those described in FIGS. 4C to 4F, an electron blocking film 21 is formed on the bottom portions of the vertical holes 38 as shown in FIG. 7E, and a p-type organic photoelectric conversion film 13 is embedded in the vertical holes 38. Moreover, a light shielding film 19 is formed on the p+-type semiconductor region 18 to thereby form a hybrid photoelectric conversion portion 14. The photoelectric conversion film 13 in the red pixel is formed of an organic material sensitive to red wavelength band, and the photoelectric conversion film 13 in the green pixel is formed of an organic material sensitive to green wavelength band.

Subsequently, similarly to the above, upper and lower electrodes are formed, pixel transistors are formed in the semiconductor region on the lower side of the lower electrode, and a multilayer wiring layer is formed. In addition, color filters having the Bayer arrangement are formed on the upper electrode on the light incident side, and on-chip microlenses are formed thereon.

Since the other configurations are the same as those of the first embodiment, redundant description thereof will be omitted. The hybrid photoelectric conversion portion of the second embodiment can be applied to hybrid photoelectric conversion portions of the respective embodiments described later.

According to the solid-state imaging device of the second embodiment and the manufacturing method thereof, since the semiconductor layer is formed by the polysilicon layer 56, when the vertical holes 38 are formed and the organic photoelectric conversion film 13 are embedded therein, the area of the interface between the surfaces of the crystalline polysilicon particles and the organic photoelectric conversion film 13 increases. Thus, the quantity of electrons moving from the organic photoelectric conversion film 13 toward the polysilicon layer 56 is increased further, and faster driving is realized. In addition to the above, the same advantages as those described in relation to the basic configuration and the first embodiment are obtained.

<5. Third Embodiment>
[Exemplary Configuration of Solid-State Imaging Device]

Figure 8A:
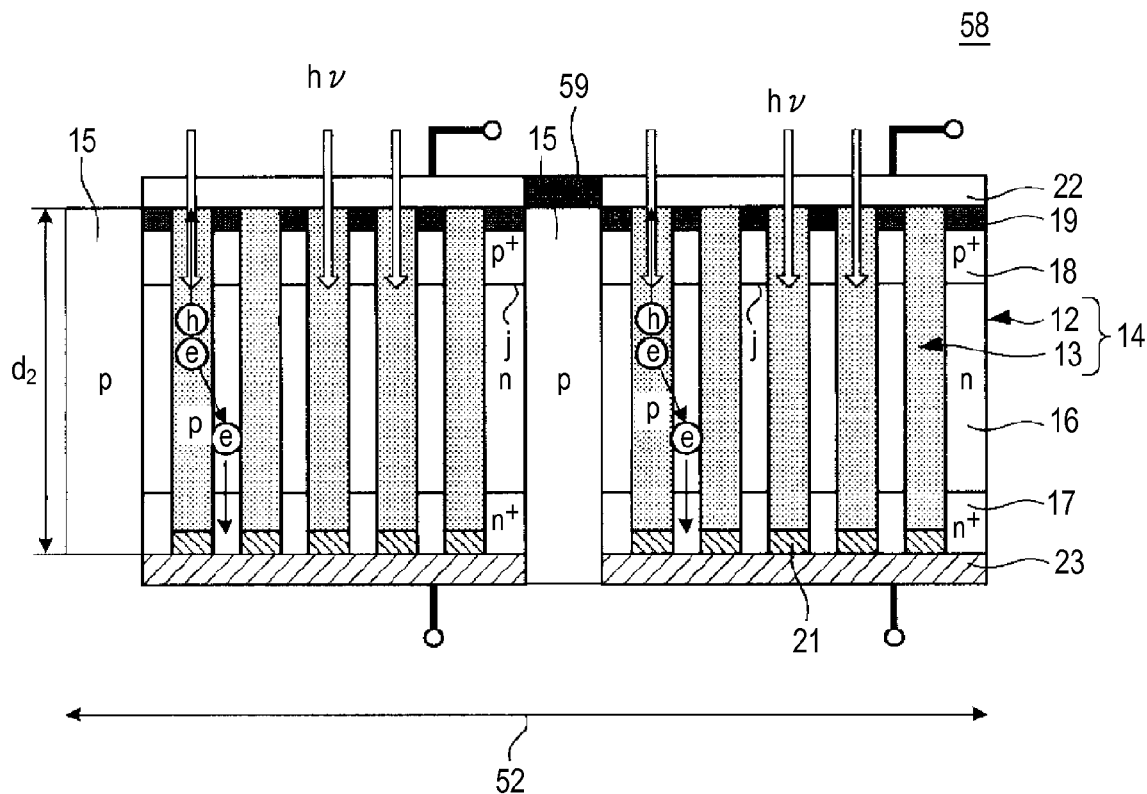
FIGS. 8A and 8B are diagrams showing a simplified configuration of a main part of a solid-state imaging device according to a third embodiment of the present disclosure.
Figure 8B:
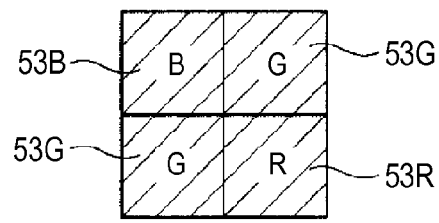

FIGS. 8A and 8B show a solid-state imaging device according to a third embodiment of the present disclosure, namely a back-illuminated CMOS solid-state imaging device. A solid-state imaging device 58 according to the third embodiment is configured to include primary color filters having the Bayer arrangement and a pixel region 52 in which a group of pixels made up of a blue (B) pixel 53B, a red (R) pixel 53R, a green (G) pixel 53G, and a green (G) pixel 53G are arranged in a two-dimensional array as shown in FIG. 8B. Moreover, the blue pixel 53B, the red pixel 53R, the green pixel 53G, and the green pixel 53G are formed by the hybrid photoelectric conversion portion 14 shown in FIGS. 1A and 1B.

In the solid-state imaging device 58 of the third embodiment, a thin single-crystalline silicon semiconductor layer 12 is divided into respective pixels by the element separation region 15 which is formed by a p-type semiconductor region. In the blue pixel 53B, the red pixel 53R and the green pixel 53G, the same p+-type semiconductor region 18, n-type semiconductor region 16, and n+-type semiconductor region 17 are formed, and a hybrid photoelectric conversion portion 14 in which a plurality of p-type organic photoelectric conversion films 13 are embedded in the semiconductor layer 12 having a p-n junction j is formed. Moreover, in the hybrid photoelectric conversion portion 14, a light shielding film 19 is formed on the light incident surface of the p+-type semiconductor region 19, and an electron blocking film 21 is formed on the surface of the photoelectric conversion portion 13 opposite to the light incident surface. Although not shown in the drawings, an insulating film is formed between the light shielding film 19 formed of a metal film, for example, and the organic photoelectric conversion film 13.

As the organic photoelectric conversion film 13 in the blue pixel 53B which is sensitive to blue wavelength band, porphyrin compounds or perylene compounds can be used. As the organic photoelectric conversion film 13 in the red pixel 53R which is sensitive to red wavelength band, organic materials such as, for example, phthalocyanine compounds, porphyrin compounds, and merocyanine compounds can be used. As the organic photoelectric conversion film 13 in the green pixel 53G which is sensitive to green wavelength band, organic materials such as, for example, quinacridone compounds and porphyrin compounds can be used. However, the kinds of organic materials are not particularly limited as long as the organic materials are organic compounds which have a higher light absorption coefficient than crystalline silicon and which have an energy band structure with respect to silicon as shown in FIG. 2A.

A pair of an upper electrode 22 and a lower electrode 23 is formed above and below the photoelectric conversion portion 14. The upper electrode 22 on the light incident side is formed of a transparent electrode. An insulating film 59 for separating pixels is formed between the upper electrodes 22 which are transparent electrodes of adjacent pixels. Although not shown in FIGS. 8A and 8B, color filters and on-chip microlenses are formed on the upper electrode 22 similarly to the above. Moreover, a semiconductor substrate in which pixel transistors are formed is disposed below the lower electrode 23 with an insulating film disposed therebetween, and a multilayer wiring layer having a plurality of layers of wirings is disposed thereon with an interlayer insulating film disposed therebetween.

In the present embodiment, one pixel has an area of 1.4 μm by 1.4 μm. The thickness d2 of the semiconductor layer 12 is set to about 300 nm although it depends on the light absorption coefficient of an organic material used. However, the thickness is not particularly limited. The other configurations are the same as those described in relation to the basic configuration shown in FIGS. 1A and 1B. Thus, portions in FIGS. 8A and 8B corresponding to those of FIGS. 1A and 1B will be denoted by the same reference numerals, and redundant description thereof will be omitted.

[Exemplary Method of Manufacturing Solid-State Imaging Device]

The processes of manufacturing the blue, red, and green pixels 53B, 53R, and 53G in the solid-state imaging device 58 of the third embodiment are the same as those illustrated in FIGS. 4A to 4F. The conditions when forming the vertical holes 38 will be described. In this example, an example of the dry-etching conditions using a CCP (Capacitive Coupled Plasma) etching apparatus will be described below. In addition, the processing conditions and other apparatuses used other than the CCP etching apparatus are not particularly limited similarly to the first embodiment.

> Gas Type and Flow Rate: $NF_3/O_2/HBr = 40/15/200$ sccm
> Pressure: 100 mT
> Upper Application Power: 700 W
> Lower Application Power: 400 W
> Etching Time: 20 sec
> RF Frequency: Upper/Lower = 40 MHz/3 MHz The baking temperature during forming of the organic photoelectric conversion film 13 was typically in the range of 80° C. and 150° C. although it depends on a solvent. The upper electrode 22 was an ITO (Indium Tin Oxide) film and is deposited on a transparent glass substrate to a thickness of about 30 nm. The lower electrode 23 was a metal electrode having a thickness of about 30 nm, and is preferably formed of metal having a low ohmic resistance to silicon, for example, such as an alloy of indium, copper, aluminum, and magnesium. The electron blocking film 21 was formed of a silicon oxide (SiO) film having a thickness of 10 nm. The light shielding film 19 was formed of a tungsten (W) film. The etch-back of the electron blocking film 21 was performed under conditions such that the etching selectivity to silicon was high.

Such conditions are as follows, for example.

Gas Type and Flow Rate: $C_4F_8/O_2/Ar=30/400/15$ sccm
Pressure: 30 mT

According to the solid-state imaging device 58 according to the third embodiment, since all photoelectric conversion portions of the blue, red, and green pixel 53B, 53R, and 53G are configured by the hybrid photoelectric conversion portion 14, it is possible to provide a solid-state imaging device enabling high-sensitivity, fast, and stable driving. In addition, since all pixels are configured by the hybrid photoelectric conversion portion, the thickness d2 of the semiconductor layer 12 can be decreased further. Thus, it is possible to decrease the thickness of the photoelectric conversion portion further more than the silicon-based photoelectric conversion portion. In addition, in the present embodiment, the thickness d2 of the photoelectric conversion portion of the entire pixel is decreased to about 300 nm. Since the photoelectric conversion portion is thin, it is possible to obtain advantages such as a reduction in the number of steps for ion implantation, a reduction in the number of steps for simulation-based evaluation, the ability to use a 3-dimensional multilayer structure, or abroad range of device applications.

In addition to the above, the same advantages as those described in relation to the basic configuration and the first embodiment are obtained.

<6. Fourth Embodiment>

[Exemplary Configuration of Solid-State Imaging Device]

Figure 9:
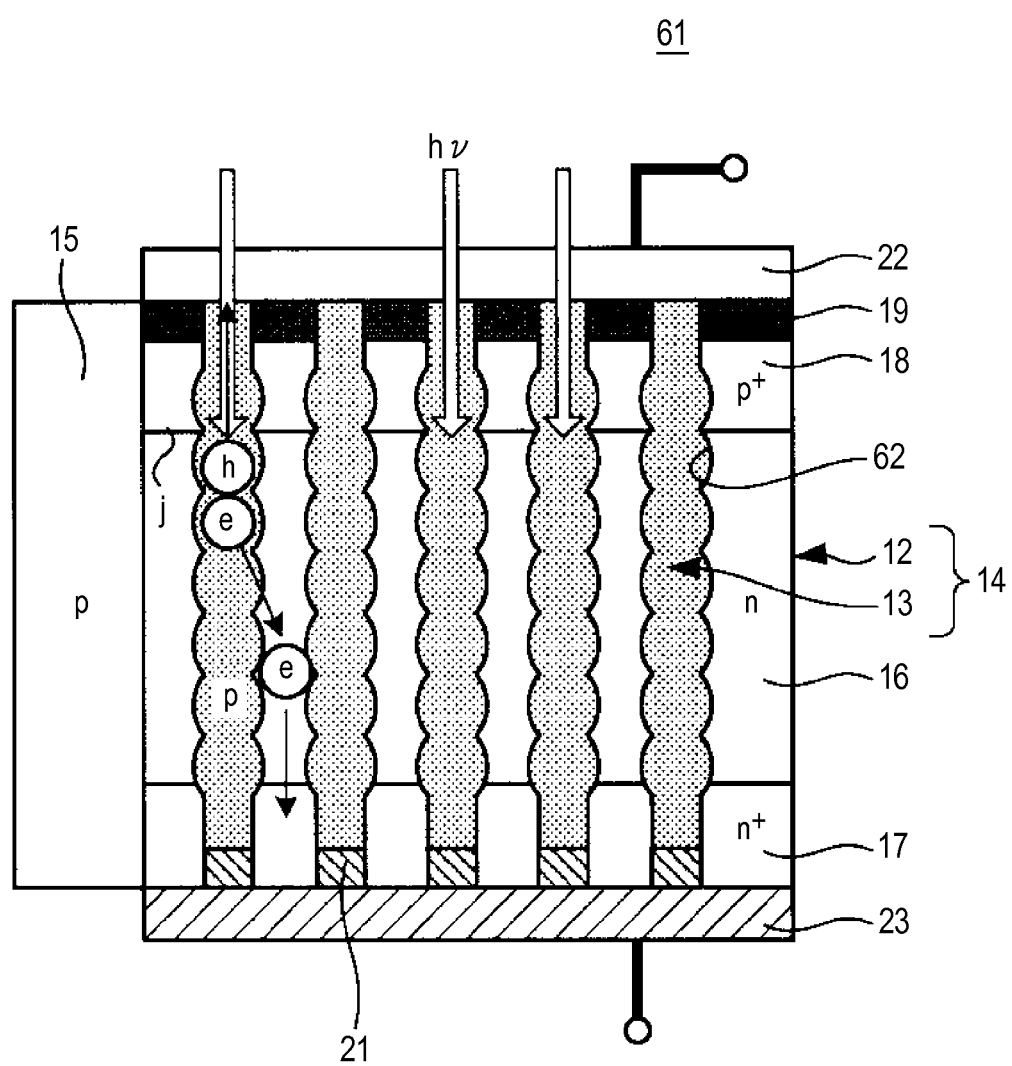
FIG. 9 is a diagram showing a simplified configuration of a main part of a solid-state imaging device according to a fourth embodiment of the present disclosure.

FIG. 9 shows a solid-state imaging device according to a fourth embodiment of the present disclosure, namely a back-illuminated CMOS solid-state imaging device. In particular, FIG. 9 shows a main part of a hybrid photoelectric conversion portion among the configurations of the solid-state imaging device. A solid-state imaging device 61 according to the fourth embodiment is configured to include a pixel region having pixels made up of a hybrid photoelectric conversion portion 14 and pixel transistors (not shown). Similarly to the above, the hybrid photoelectric conversion portion 14 has a configuration in which a plurality of p-type organic photoelectric conversion films 13 is embedded in a thin semiconductor layer 12 on which a $p^+$-type semiconductor region 18, an n-type semiconductor region 16, and an $n^+$-type semiconductor region 17 are formed.

In the present embodiment, in particular, in the hybrid photoelectric conversion portion 14, a concavo-convex shape is formed at the interface between the semiconductor layer 12 and the organic photoelectric conversion film 13. The concavo-convex shape is obtained by forming vertical holes 62 in which the organic photoelectric conversion film is embedded using the Bosch process in the manufacturing process described later.

The solid-state imaging device of the fourth embodiment is configured by substituting the pixels having the hybrid photoelectric conversion portion of which the interface has a concavo-convex shape into the red and green pixels 53R and 53G of the first embodiment or into all the blue, red, and green pixels 53B to 53G of the third embodiment. The other configurations are the same as those described in the first and third embodiments. Thus, the corresponding portions will be denoted by the same reference numerals, and redundant description thereof will be omitted.

[Exemplary Method of Manufacturing Solid-State Imaging Device]

The process of manufacturing the hybrid photoelectric conversion portion in the solid-state imaging device 61 of the fourth embodiment is basically the same as that shown in FIGS. 4A to 4F, except for the step of forming vertical holes. In the present embodiment, when forming vertical holes in which the organic photoelectric conversion film 13 is embedded, vertical holes 62 of which the inner walls have a concavo-convex shape are formed using a processing method (so-called Bosch process) wherein an etching step and a deposition step are alternately repeated. By embedding the organic photoelectric conversion film 13 into the vertical holes 62 of which the inner walls have a concavo-convex shape, the interface between the semiconductor layer 12 and the organic photoelectric conversion film 13 is formed into the concavo-convex shape.

In this example, an example of the dry-etching conditions using a CCP etching apparatus will be described below. The size of concavo-convex patterns can be controlled by controlling the flow rate ratio of $SF_6$ gas to $C_4F_8$ gas and adding $O_2$ gas to $SF_6$ gas so as to accelerate protection of the inner walls.

| | Etching Step | Deposition Step |
|---|---|---|
| Gas Type and Flow Rate: | SF6 = 30 sccm | C4F8 = 20 sccm |
| Pressure: | 10 mT | 10 mT |
| Upper Application Power: | 500 W | 500 W |
| Lower Application Power: | 30 W | 40 W |
| Step Time: | 12 sec | 10 sec |

According to the solid-state imaging device 61 according to the fourth embodiment, in the hybrid photoelectric conversion portion 14, since the interface between the semiconductor layer 12 and the organic photoelectric conversion film 13 has a concavo-convex shape, the interface area increases. Thus, it is possible to accelerate the movement of electrons from the organic photoelectric conversion film 13. Due to the accelerated electron mobility, it is possible to perform faster driving.

In addition to the above, the same advantages as those described in relation to the basic configuration and the first embodiment are obtained. In addition, the hybrid photoelectric conversion portion of the fourth embodiment can be applied to the hybrid photoelectric conversion portions of the respective embodiments of the present disclosure.

<7. Fifth Embodiment>
[Exemplary Configuration of Solid-State Imaging Device]

Figure 10A:
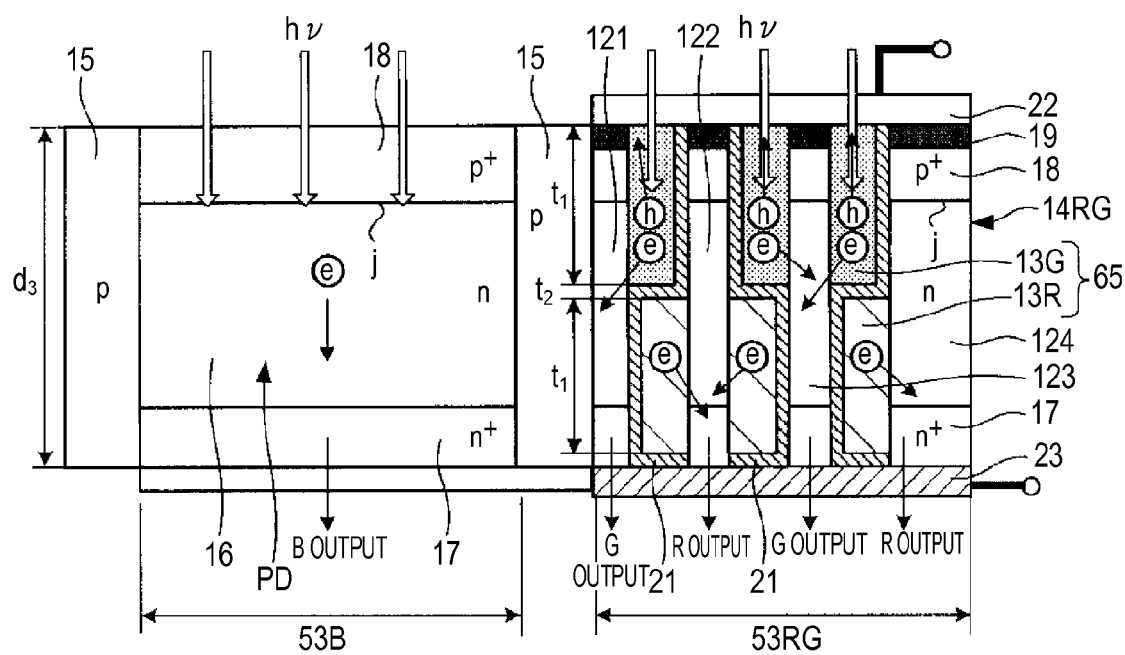
FIGS. 10A and 10B are diagrams showing a simplified configuration of a main part of a solid-state imaging device according to a fifth embodiment of the present disclosure.
Figure 10B:
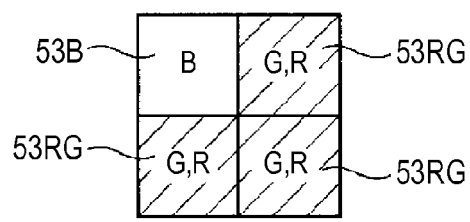

FIGS. 10A and 10B show a solid-state imaging device according to a fifth embodiment of the present disclosure, namely a back-illuminated CMOS solid-state imaging device. A solid-state imaging device 64 according to the fifth embodiment is configured to include a pixel region in which a group of four pixels made up of one blue pixel 53B and three neighboring identical red and green pixels 53RG are arranged in a two-dimensional array as shown in FIG. 10B. Moreover, the blue pixel 53B is formed to have a photoelectric conversion portion which is formed by a photodiode PD formed in a silicon semiconductor region. The identical pixels 53RG are configured to have a two-layer photoelectric conversion portion 14RG in which red and green hybrid photoelectric conversion portions are stacked.

That is, in the present embodiment, the thin single-crystalline semiconductor layer 12 is divided into respective pixels by an element separation region 15 which is formed by a p-type semiconductor region. In the blue pixel 53B, a $p^+$-type semiconductor region 18, an n-type semiconductor region 16, and a $n^+$-type semiconductor region 17 are formed in the semiconductor layer 12, and a photoelectric conversion portion formed of a photodiode PD having a p-n junction j is formed. In the identical pixels 53RG, the $p^+$-type semiconductor region 18, the n-type semiconductor region 16, and the $n^+$-type semiconductor region 17 are formed, and a plurality (three in this example) of two-layer organic films 65 is embedded in the semiconductor layer 12 having a p-n junction j. The two-layer organic film 65 is formed by stacking organic films 13G and 13R sensitive to green and red wavelength bands (hereinafter referred to as green and red organic photoelectric conversion films) in two layers. The green and red organic photoelectric conversion films 13G and 13R are preferably stacked in the order of the green organic photoelectric conversion film 13G and the red organic photoelectric conversion film 13R from the upper layer. The number of two-layer organic films 65 made up of the green and red organic photoelectric conversion films 13G and 13R is preferably an odd number so that the output signal intensities of green and red are approximately equal to each other.

Although three two-layer organic films 65 are illustrated in FIGS. 10A and 10B in order to make it easy to understand the number, in the present embodiment, six two-layer organic films 65 are formed. The thickness d3 of the semiconductor layer 12 in the blue pixel 53 is about 1 μm. The thicknesses t1 of the green and red organic photoelectric conversion films 13G and 13R in the identical pixels 53RG can be set to about 0.5 μm. The pixel has an area of 1.4 μm by 1.4 μm.

The semiconductor layer 12 is divided into four semiconductor layer portions 121 to 124 by three two-layer organic films 65. The green and red organic photoelectric conversion films 13G and 13R which constitute the two-layer organic film 65 are separated from each other by electron blocking films 21. In addition, the electron blocking films 21 are extended to the interfaces between the green organic photoelectric conversion film 13G and the second and fourth semiconductor layer portions 122 and 124 so that electrons generated in the green organic photoelectric conversion film 13G move to only the first and third semiconductor layer portions 121 and 123. Moreover, the electron blocking films 21 are extended to the interfaces between the red organic photoelectric conversion film 13R and the first and third semiconductor layer portions 121 and 123 so that electrons generated in the red organic photoelectric conversion film 13R move to only the second and fourth semiconductor layer portions 122 and 124. These electron blocking films 21 are configured to prevent a color mixture and to extract electrons of each color separately and are formed of a transparent insulating film (for example, a silicon oxide film) having a thickness t2 of about 10 nm. In addition, the electron blocking film 21 is also formed on the bottom portion of the organic photoelectric conversion film, namely between the red organic photoelectric conversion film 13R and the lower electrode 23 similarly to the above.

A blue color filter (not shown) is formed in the blue pixel 53B, and a yellow color filter (not shown) capable of transmitting green and red light components is formed in the identical pixels 53RG.

The other configurations are the same as those of the first embodiment shown in FIGS. 6A and 6B and the basic configuration shown in FIGS. 1A and 1B. Thus, the corresponding portions will be denoted by the same reference numerals, and redundant description thereof will be omitted.

Next, the operation of the solid-state imaging device 64 of the fifth embodiment will be described. A necessary bias voltage is applied between the upper electrode 22 and the lower electrode 23 so that the upper electrode 22 has the negative potential, and the lower electrode 23 has the positive potential. In the blue pixel 53B, incident light hv is subjected to photoelectric conversion in the photodiode PD, and the generated electrons serving as signal charges are output as blue signals through the pixel transistors.

On the other hand, in the identical pixels 53RG, the incident light hv is subjected to photoelectric conversion in the green and red organic photoelectric conversion films 13G and 13R, whereby electron-hole pairs are generated. The electrons e serving as signals charges generated in the green organic photoelectric conversion film 13G move toward the first and third semiconductor layer portions 121 and 123 and inside the semiconductor layer portions 121 and 123 and are output as green signals through the pixel transistors. The holes h generated in the green organic photoelectric conversion film 13G are discharged through the upper electrode 22 which is a transparent electrode. The electrons e serving as signals charges generated in the red organic photoelectric conversion film 13R move toward the second and fourth semiconductor layer portions 122 and 124 and inside the semiconductor layer portions 122 and 124 and are output as red signals through the pixel transistors. The holes h generated in the red organic photoelectric conversion film 13R are discharged through the upper electrode 22 which is a transparent electrode while escaping the electron blocking film 21.

[Exemplary Method of Manufacturing Solid-State Imaging Device]

Figure 11A:
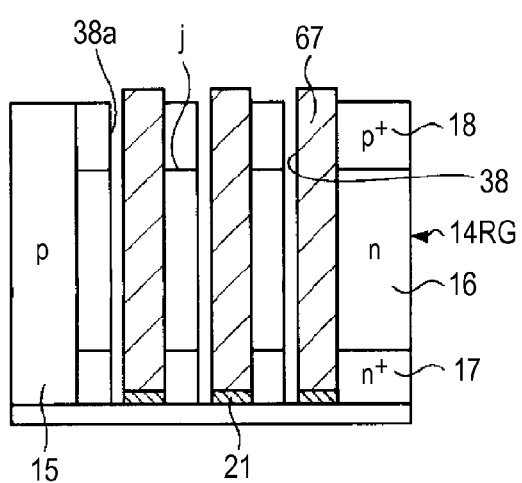
FIGS. 11A to 11F are process diagrams showing the main part according to the fifth embodiment and an exemplary manufacturing method thereof.

FIGS. 11A to 11F show an exemplary method of manufacturing the solid-state imaging device 64 of the fifth embodiment, in particular, an exemplary method of forming the hybrid photoelectric conversion portion 14 having the two-layer organic film 65 of the identical pixels 53RG. As shown in FIG. 11A, an odd number of vertical holes 38 are formed, by dry-etching, in a semiconductor layer 12 in which an $n^+$-type semiconductor region, an n-type semiconductor region, and a $p^+$-type semiconductor region are formed by implanting impurities as shown. By the same method, an electron blocking film 21 is formed of a silicon oxide film, for example. Subsequently, a resist mask 67 is selectively formed in the respective vertical holes 38 with a separation width of about 10 nm from one of the inner walls, namely so that a gap 38a having a width of 10 nm is left.

Figure 11D:
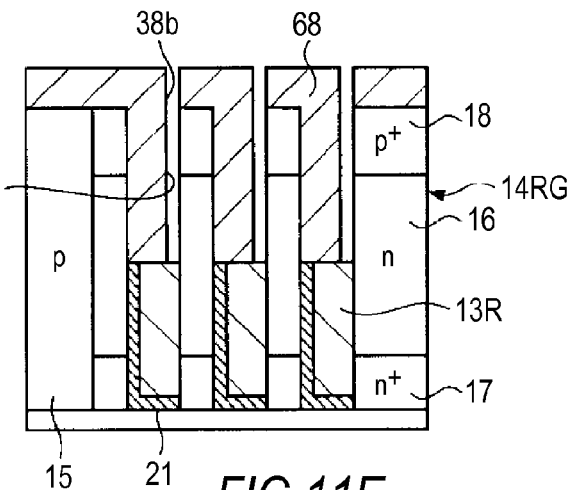
Figure 11B:
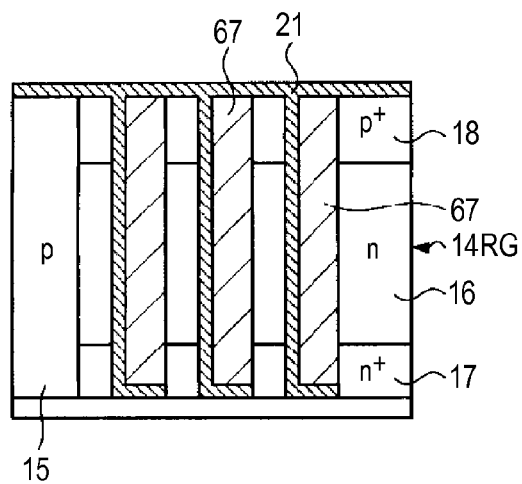

Subsequently, as shown in FIG. 11B, an electron blocking film 21 formed of a silicon oxide film, for example, is formed over the upper surface of the semiconductor layer 12 including the insides of the gap 38a of the vertical holes 38.

Subsequently, the electron blocking films 21 on the upper side are etched back under the conditions of high etching selectivity to silicon so that the electron blocking films 21 having a height of 0.5 μm are left in the gaps 38a. The conditions for the etching selectivity are as follows, for example.

Gas Type and Flow Rate: $C_4F_8/O_2/Ar=30/400/15$ sccm
Pressure: 30 mT

Figure 11E:
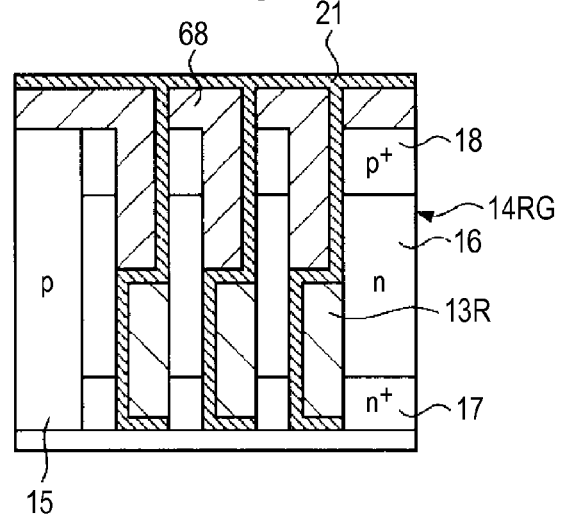
Figure 11C:
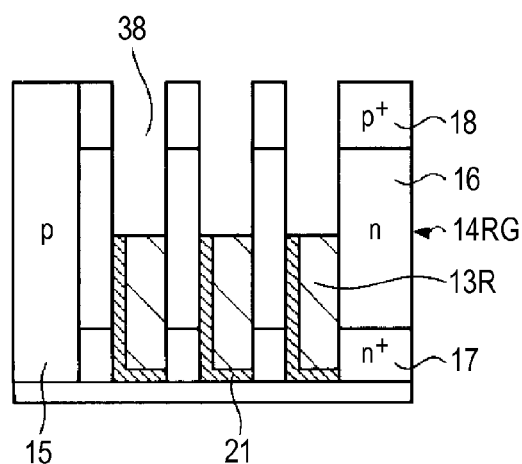

Subsequently, as shown in FIG. 11C, the resist mask 67 is delaminated and removed by oxygen ($O_2$) ashing, for example, and a red organic photoelectric conversion film 13R is embedded to a thickness of 0.5 μm into the vertical holes 38 by deposition.

Subsequently, as shown in FIG. 11D, an electron blocking film 21 is formed on the surface of the red organic photoelectric conversion film 13R. After forming the electron blocking film 21, dry etch-back is performed under the same conditions as above until the residual film thickness becomes 10 nm. Subsequently, a resist film 68 is selectively formed with a separation width of about 10 nm from one of the inner walls on the upper portions of the vertical holes 38, namely so that a gap 38b having a width of about 10 nm is left.

Subsequently, as shown in FIG. 11E, an electron blocking film 21 formed of a silicon oxide film, for example, is formed over the upper surface of the semiconductor layer 12 including the insides of the gaps 38b.

Subsequently, the other electron blocking films 21 are removed by performing dry etch-back under the same conditions as above so that the electron blocking films 21 in the gaps 38b are left. After that, the resist mask 68 is delaminated and removed.

Figure 11F:
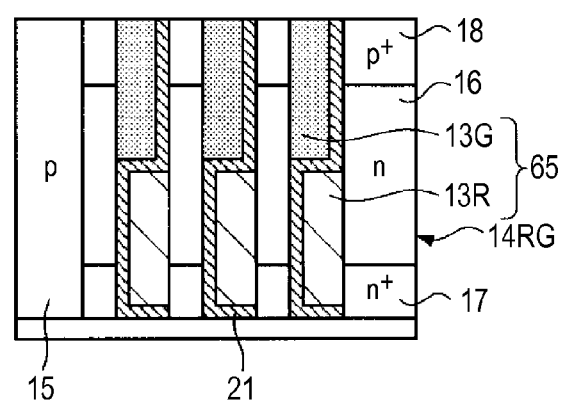

Subsequently, as shown in FIG. 11F, a green organic photoelectric conversion film 13G is embedded to a thickness of 0.5 μm into the upper portions of the vertical holes 38 by deposition. Subsequently, a light shielding film 19 is formed on the surfaces of the $p^+$-type semiconductor regions 18 of the respective semiconductor layer portions 121 to 124.

Subsequently, although not shown in the drawing, similarly to the above, the upper electrode 22 and the lower electrode 23 which are transparent electrodes are formed. Moreover, the description of the steps of forming the respective pixel transistors, multilayer wiring layers color filters, and on-chip microlenses of the blue pixel 53B and the identical pixels 53RG will be omitted.

According to the solid-state imaging device 64 according to the fifth embodiment, the green and red pixels are configured as the identical pixels 53RG in which the green and red organic photoelectric conversion films 13G and 13R are stacked in two layers. Thus, under the same number of pixels, the effective light collecting area becomes 2.2 or 1.1 times that of the back-illuminated solid-state imaging device (in which color filters have the Bayer arrangement) having the silicon-based structure of the related art. Ideally, if an organic material having quantization efficiency of 0.5 times or greater than that of silicon, the red sensitivity is increased by 1.1 times or more, and substantially the same green sensitivity as the silicon-based structure can be realized. Moreover, the thicknesses of the photoelectric conversion portions of all pixels can be decreased to about 1 μm from about 3 μm of the related art.

In addition to the above, the same advantages as those described in relation to the basic configuration and the first embodiment are obtained.

<8. Sixth Embodiment>

[Exemplary Configuration of Solid-State Imaging Device]

Figure 12A:
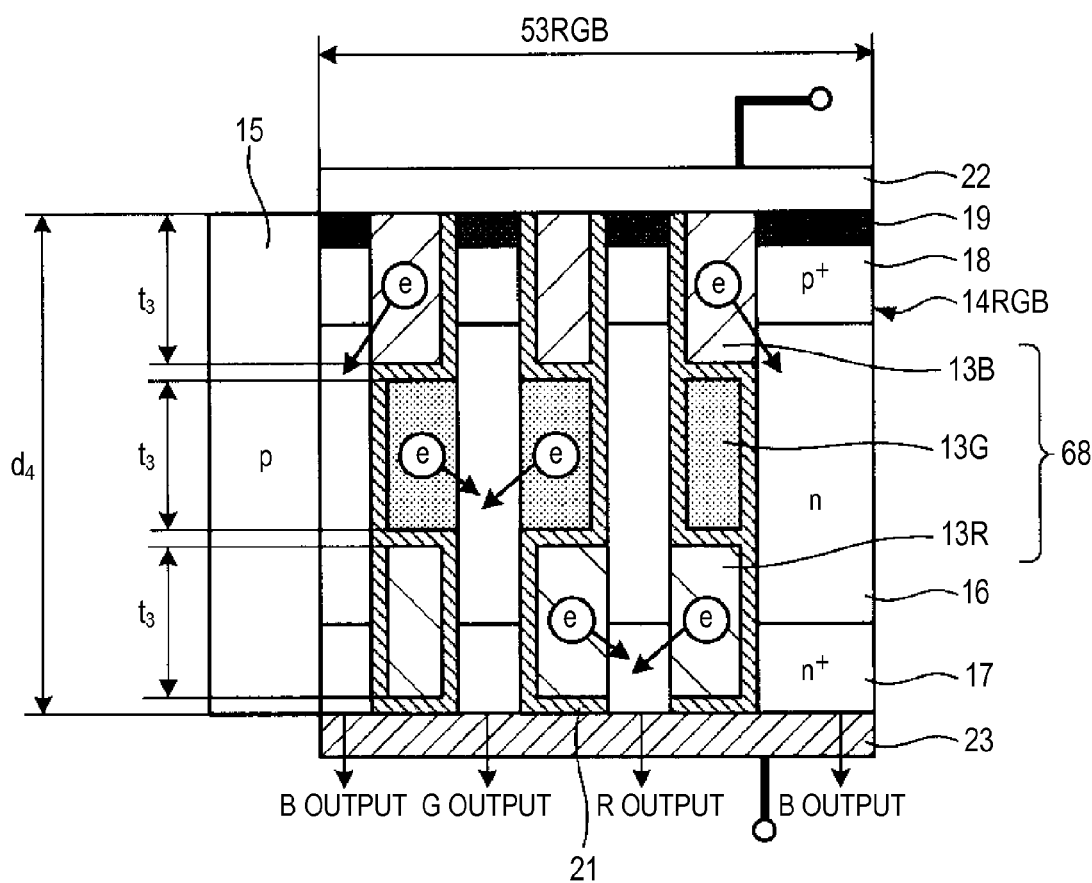
FIGS. 12A and 12B are diagrams showing a simplified configuration of a main part of a solid-state imaging device according to a sixth embodiment of the present disclosure.
Figure 12B:
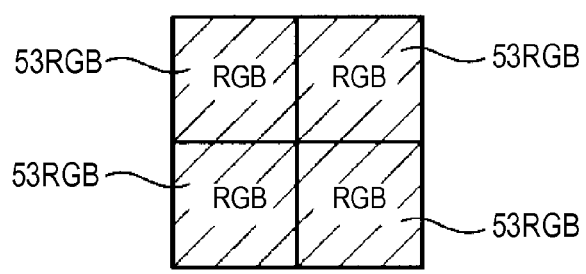

FIGS. 12A and 12B show a solid-state imaging device according to a sixth embodiment of the present disclosure, namely a back-illuminated CMOS solid-state imaging device. A solid-state imaging device 67 according to the sixth embodiment is configured to include a pixel region in which red, green, and blue pixels are configured as identical pixels 53RGB, and the identical pixels 53RGB are arranged in a two-dimensional array. The identical pixels 53RGB are configured to have a three-layer photoelectric conversion portion 14RGB in which red, green, and blue hybrid photoelectric conversion portions are stacked in three layers.

That is, in the present embodiment, a thin single-crystalline silicon semiconductor layer 12 is divided into respective pixels by the element separation region 15 which is formed by a p-type semiconductor region. Each pixel region is configured by the identical pixel 53RGB. In the identical pixels 53RGB, the $p^+$-type semiconductor region 18, the n-type semiconductor region 16, and the $n^+$-type semiconductor region 17 are formed, and a plurality (three in this example) of three-layer organic films 68 is embedded in the semiconductor layer 12 having a p-n junction j. The three-layer organic film 68 is formed by stacking organic films 13B, 13G, and 13R sensitive to blue, green, and red wavelength bands (hereinafter referred to as blue, green, and red organic photoelectric conversion films) in three layers.

Since the solid-state imaging device 67 having the three-layer organic film 68 can disperse incident light hv in the vertical direction, color filters and optical low-pass filters are not necessary. The blue, green, and red organic photoelectric conversion films 13B, 13G, and 13R are preferably stacked in the order of the blue organic photoelectric conversion film 13B, the green organic photoelectric conversion film 13G, and the red organic photoelectric conversion film 13R from the upper layer. The number of three-layer organic films 68 made up of the blue, green, and red organic photoelectric conversion films 13B, 13G, and 13R is preferably the multiple of 3 so that the output signal intensities of blue, green, and red are approximately equal to each other.

Although three two-layer organic films 68 are illustrated in FIGS. 12A and 12B in order to make it easy to understand the number, in the present embodiment, six three-layer organic films 68 are formed. The thickness of the three-layer organic film 68 in the identical pixel 53RGB is about 600 nm. The thicknesses of the respective color organic photoelectric conversion films 13B, 13G, and 13R are about 0.2 μm. The pixel has an area of 1.4 μm by 1.4 μm.

The semiconductor layer 12 is divided into four semiconductor layer portions 121 to 124 by three three-layer organic films 68. The blue, green, and red organic photoelectric conversion films 13B, 13G, and 13R which constitute the three-layer organic film 68 are separated from each other by electron blocking films 21. In addition, the electron blocking films 21 are formed at the interfaces between the blue organic photoelectric conversion film 13B and the second and third semiconductor layer portions 122 and 123 so that electrons generated in the blue organic photoelectric conversion films 13B of the first and third three-layer organic films 68 move to only the first and fourth semiconductor layer portions 121 and 124. Moreover, the electron blocking films 21 are formed at the interfaces between the green organic photoelectric conversion film 13G and the first and third semiconductor layer portions 121 and 123 so that electrons generated in the green organic photoelectric conversion films 13G of the second and third three-layer organic films 68 move to only the second semiconductor layer portion 122. Furthermore, the electron blocking films 21 are formed at the interfaces between the red organic photoelectric conversion film 13R and the second and fourth semiconductor layer portions 122 and 124 so that electrons generated in the red organic photoelectric conversion films 13R of the second and third three-layer organic films 68 move to only the third semiconductor layer portion 123.

The entire peripheries of the red, blue, and green organic photoelectric conversion films 13R, 13B, and 13R of the first, second, and third three-layer organic films 38 are covered by the electron blocking films 21. In addition, the electron blocking film 21 is also formed on the bottom portion of the organic photoelectric conversion film, namely the respective three-layer organic films 68 similarly to the above.

The other configurations are the same as those of the first embodiment and the basic configuration. Thus, the corresponding portions will be denoted by the same reference numerals, and redundant description thereof will be omitted.

Next, the operation of the solid-state imaging device 67 of the sixth embodiment will be described. A necessary bias voltage is applied between the upper electrode 22 and the lower electrode 23 so that the upper electrode 22 has the negative potential, and the lower electrode 23 has the positive potential. In the identical pixels 53RGB, the incident light hv is subjected to photoelectric conversion in the blue, green, and red organic photoelectric conversion films 13B, 13G, and 13R, whereby electron-hole pairs are generated. The electrons e serving as signals charges generated in the blue organic photoelectric conversion film 13B move toward the first and fourth semiconductor layer portions 121 and 124 and inside the semiconductor layer portions 121 and 124 and are output as blue signals through the pixel transistors. The holes h generated in the blue organic photoelectric conversion film 13B are discharged through the upper electrode 22 which is a transparent electrode.

The electrons e serving as signals charges generated in the green organic photoelectric conversion film 13G move toward the second semiconductor layer portion 122 and inside the semiconductor layer portion 122 and are output as green signals through the pixel transistors. The electrons e serving as signals charges generated in the red organic photoelectric conversion film 13R move toward the third semiconductor layer portion 123 and inside the semiconductor layer portion 123 and are output as red signals through the pixel transistors. The holes h generated in the green and red organic photoelectric conversion films 13G and 13R are discharged through the upper electrode 22 while escaping the electron blocking film 21. The electrons generated in the red, blue, and green organic photoelectric conversion films 13R, 13B, and 13G of the first, second, and third three-layer organic films 68 do not move anywhere but recombine with the lapse of time and are not used as signals.

[Exemplary Method of Manufacturing Solid-State Imaging Device]

The solid-state imaging device 67 of the sixth embodiment, in particular, the hybrid photoelectric conversion portion having the three-layer organic film 68 of the identical pixels 53RGB can be formed by using the processes described in FIGS. 11A to 11F. That is, the three-layer organic film 68 can be formed by repeating the processes of forming the respective color organic photoelectric conversion films and the electron blocking films using the processes of forming the two-layer organic film described in FIGS. 11A to 11F.

According to the solid-state imaging device 67 according to the sixth embodiment, the blue, green, and red pixels are formed as the identical pixels 53RGB in which the blue, green, and red organic photoelectric conversion films 13B, 13G, and 13R are stacked in three layers. Thus, under the same number of pixels, the effective light collecting area becomes 2.8 times that of the back-illuminated solid-state imaging device (in which color filters have the Bayer arrangement) having the silicon-based structure of the related art. In addition, the effective light collecting area can be improved by three times or more considering the non-presence of color filters and optical low-pass filters in which the rate of optical loss is about 10%. Ideally, if an organic material having quantization efficiency of 0.5 times or greater than that of silicon, the effective light collecting area is increased by 3 times or more, and the sensitivity is increased by 1.5 times or more. Moreover, the thicknesses d4 of the photoelectric conversion portions of all pixels can be decreased to about 0.6 µm from about 3 µm of the related art.

Thus, it is possible to improve light incidence efficiency as compared to the silicon-based structure of the related art. Since red, green, and blue are detected by the same pixel region, it is possible to suppress false color as compared to the silicon-based structure. In addition to the above, the same advantages as those described in relation to the basic configuration and the first embodiment are obtained.

<9. Seventh Embodiment>
[Exemplary Configuration of Solid-State Imaging Device and Exemplary Manufacturing Method Thereof]

A solid-state imaging device according to a seventh embodiment of the present disclosure, namely, a bask-illuminated CMOS solid-state imaging device is has a configuration in which in the solid-state imaging device of the fifth or sixth embodiment, the vertical holes in which the organic photoelectric conversion film is embedded are formed into a concavo-convex shape. That is, the solid-state imaging device according to the seventh embodiment is formed by forming the vertical holes in which the organic photoelectric conversion film in the fifth or sixth embodiment is embedded using the Bosch process described in the fourth embodiment.

In the method of manufacturing the solid-state imaging device according to the seventh embodiment, in particular, when forming the hybrid photoelectric conversion portion, the vertical holes in which the organic photoelectric conversion films are embedded is formed using the Bosch process. The other processes for forming the hybrid photoelectric conversion portion are the same as those shown in FIGS. 4A to 4F.

According to the solid-state imaging device according to the seventh embodiment, it is possible to further accelerate the movility of electrons from the organic photoelectric conversion film to the silicon semiconductor layer as compared to the solid-state imaging device of the fifth or sixth embodiment. In addition to the above, the same advantages as those described in relation to the basic configuration and the fifth and sixth embodiments are obtained.

Figure 2A:
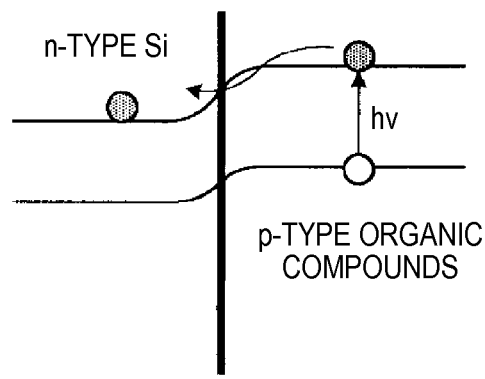
FIGS. 2A and 2B are diagrams showing the energy band at the interface between silicon and an organic photoelectric conversion film.
Figure 2B:
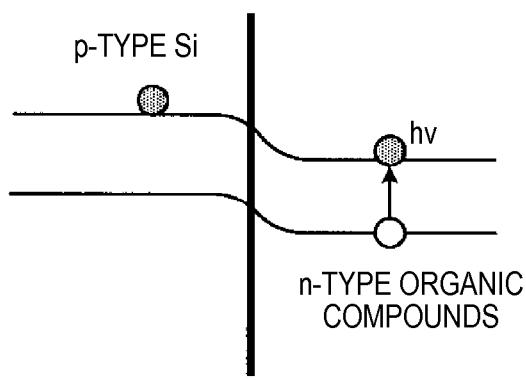

In the first to seventh embodiments described above, although electrons e are used as signal charges, by using the basic configuration shown in FIGS. 2A and 2B in which holes h are used as signal charges, the solid-state imaging device according to the first to seventh embodiments can be substituted into a solid-state imaging device in which holes h are used as signal charges. In that case, the conductivity types of the respective organic photoelectric conversion films and semiconductor regions are changed to the opposite conductivity types.

<10. Eighth Embodiment>
[Exemplary Configuration of Solid-State Imaging Device]

Figure 13:
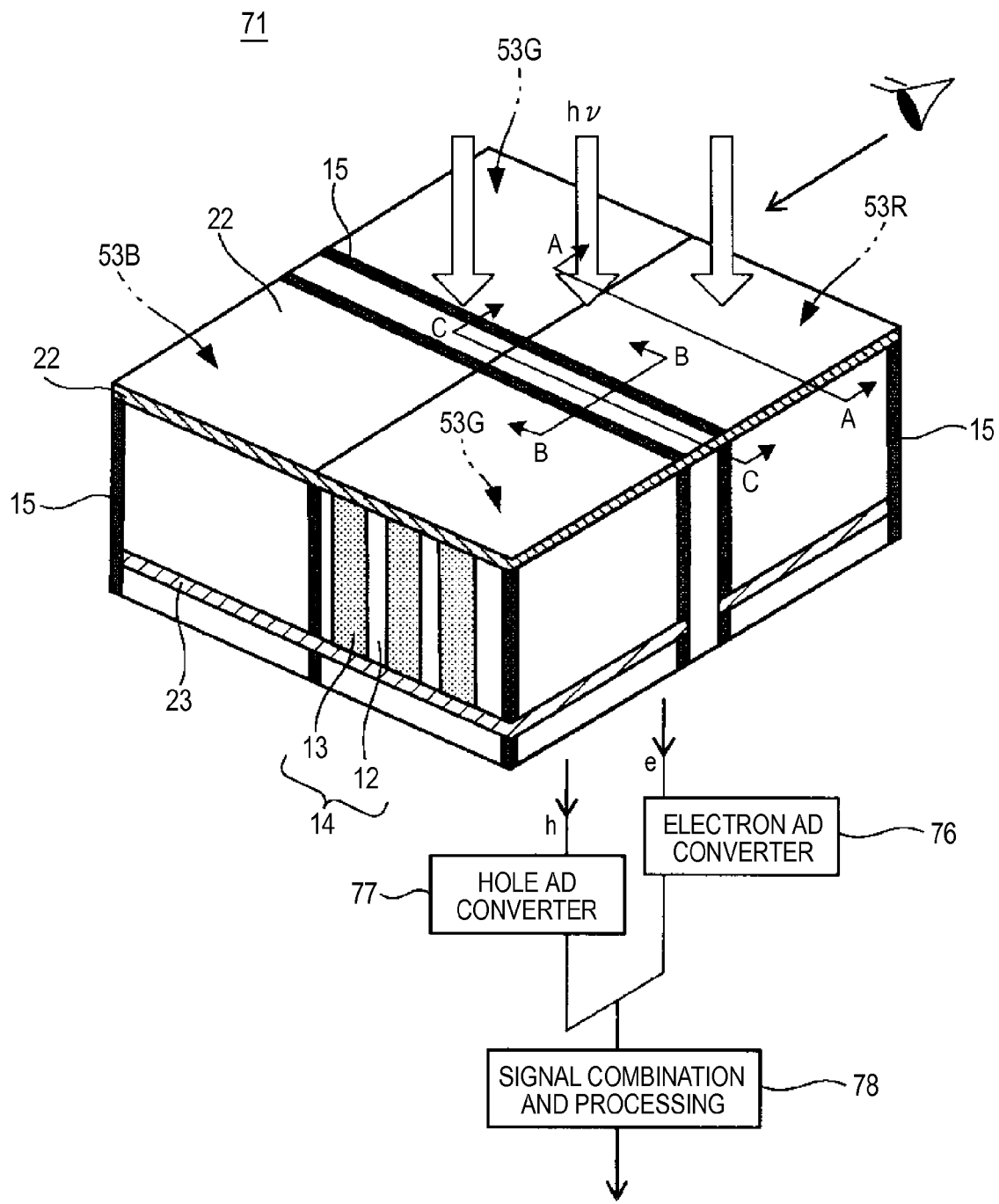
FIG. 13 is a diagram showing a simplified configuration of a main part of a solid-state imaging device according to an eighth embodiment of the present disclosure.
Figure 14A:
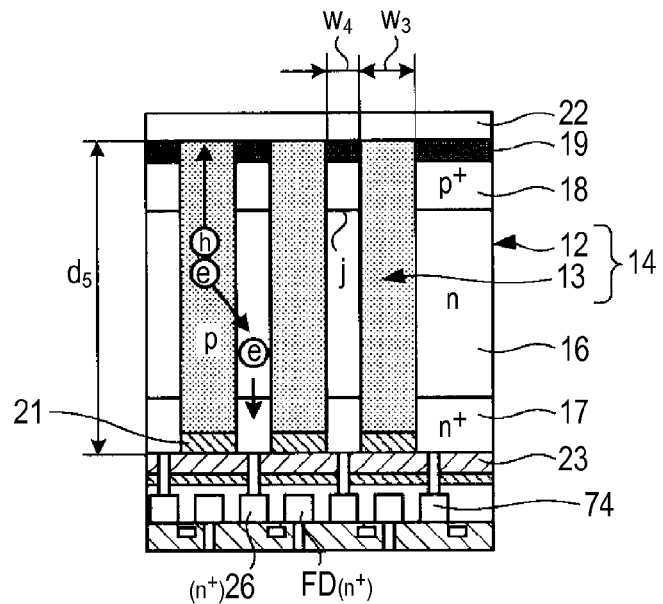
FIGS. 14A to 14C are simplified cross-sectional views taken along the lines A-A, B-B, and C-C in FIG. 13, respectively.
Figure 14B:
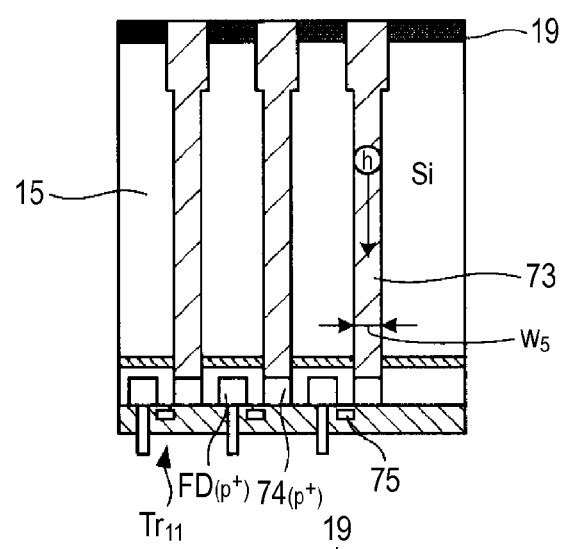
Figure 14C:
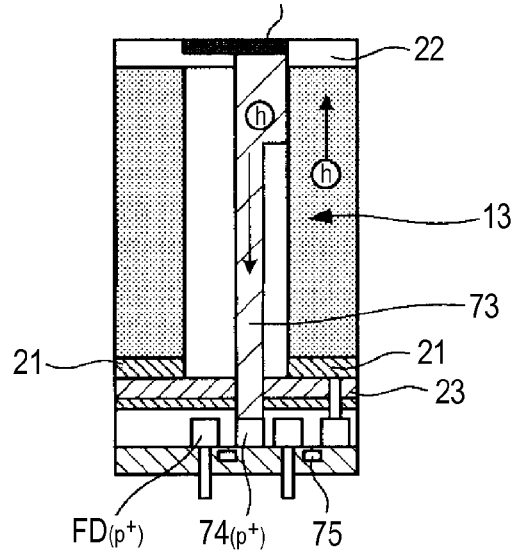

FIG. 13 and FIGS. 14A to 14C show a solid-state imaging device according to an eighth embodiment of the present disclosure, namely a back-illuminated CMOS solid-state imaging device. FIG. 13 is a perspective view showing a simplified configuration corresponding to the four pixels of red, blue, green, and green pixels of the solid-state imaging device according to the third embodiment. FIGS. 14A to 14C are cross-sectional views taken along the lines A-A, B-B, and C-C in FIG. 13, respectively.

A solid-state imaging device 71 according to the eighth embodiment is configured to include a pixel region in which a group of red, blue, green, and green pixels corresponding to the Bayer arrangement are arranged in a two-dimensional array as shown in FIG. 13. The respective pixels are divided by an element separation region which is formed by a p-type semiconductor region. The respective pixels 53R, 53G, and 53B include the hybrid photoelectric conversion portion 14 and the plurality of pixel transistors shown in FIGS. 1A and 1B. That is, as shown in FIG. 14A, the respective color pixels include the hybrid photoelectric conversion portion 14 in which a plurality of organic photoelectric conversion films 13 sensitive to light having the wavelengths of the corresponding colors is embedded into a semiconductor layer 12 having a $p^+$-type semiconductor region 18, an n-type semiconductor region 16, and an $n^+$-type semiconductor region 17. The semiconductor layer 12 divided by the organic photoelectric conversion films 13 is used for the movement of electrons e of the generated electron-hole pairs. The other configurations of the respective color pixels 53R, 53G, and 53B are the same as those described in relation to FIGS. 1A and 1B. Thus, the corresponding portions will be denoted by the same reference numerals, and redundant description thereof will be omitted.

Moreover, the pixels neighboring each other in the horizontal direction of the pixel region are completely separated in the element separation region 15. On the other hand, as shown in FIGS. 14B and 14C, in the element separation region 15 between the pixels neighboring each other in the vertical direction of the pixel region, wiring layers 73 are formed so as to be provided for the movement of holes h of the electron-hole pairs generated in the organic photoelectric conversion films 13 of one pixel described later. The wiring layers 73 can be formed of copper wiring or organic wirings such as carbon nanotubes, for example. On the element separation region 15 between the pixels neighboring in the vertical direction, the light shielding film 19 on the upper portion of the semiconductor layer of the hybrid photoelectric conversion portion 14 is extended. Moreover, the respective wiring layers 73 have their upper portions being in contact with the lateral surfaces on the upper side of the organic photoelectric conversion film 13 and have their lower portions being connected to p-type charge accumulation regions 74 which constitute transfer transistors Tr11.

The wiring layers 73 corresponding to one pixel are formed so as to correspond to a plurality of pixel transistors, and at least the transfer transistors Tr11 are formed in a number corresponding to the number of wiring layers 73 for one pixel. The transfer transistor Tr11 is configured to include the p-type charge accumulation region 74, a transfer gate electrode 75, and a p-type floating diffusion FD. The other common amplification transistor, reset transistor, and select transistor are also formed by a p-channel transistor. The p-type floating diffusions FD corresponding to the respective wiring layers 73 are commonly connected to the amplification gate electrode of the amplification transistor.

A pixel transistor including the transfer transistor Tr1 for transferring electrons e and the transfer transistor Tr11 for transferring hole h may also be configured by an organic thin-film transistor (organic TFT), for example. The other pixel transistors (the amplification, reset, and select transistors) may also be configured by an organic TFT.

Although three organic photoelectric conversion films 13 are illustrated in FIG. 13 and FIGS. 14A to 14C in order to make it easy to understand the number, in the present embodiment, six organic photoelectric conversion films 13 are formed. The width w3 of the organic photoelectric conversion film is set to about 200 nm, the width w4 between the organic photoelectric conversion films 13 is set to about 50 nm, and the width w5 of the hole wiring layer 73 is set to about 100 nm. The pixel including the wiring layer has an area of 1.65 µm by 1.65 µm.

Next, the operation of the solid-state imaging device 71 of the eighth embodiment will be described. A necessary bias voltage is applied between the upper electrode 22 and the lower electrode 23 so that the upper electrode 22 has the negative potential, and the lower electrode 23 has the positive potential. Light hv enters the p-type organic photoelectric conversion films 13 of the respective pixels, and electron-hole pairs are generated in the respective organic photoelectric conversion films 13. Hereinafter, the operation in one pixel will be described. The electrons e of the electron-hole pairs move to the semiconductor layer 12 and inside the semiconductor layer 12 and are accumulated in an n-type charge accumulation region 26 as shown in FIG. 14A. By the driving of the pixel transistors, the electrons e are transferred to the n-type floating diffusions FD, and thereafter, the electrons e in the respective floating diffusions FD are output as signals through the common amplification transistor and the like.

On the other hand, the holes h of the electron-hole pairs move to the wiring layers 73 and are accumulated in the p-type charge accumulation regions 74 through the wiring layers 73 as shown in FIGS. 14B and 14C. Here, the holes h in the organic photoelectric conversion films 13 move to the wiring layers since the barrier between the organic photoelectric conversion films 13 and the wiring layers 73 is lower than the barrier between the organic photoelectric conversion films 13 and the upper electrode 22 which is a transparent electrode. After that, by the driving of the pixel transistors, the hole h in the respective p-type charge accumulation regions 74 are transferred to the respective p-type floating diffusions FD, and the holes h in the respective floating diffusions FD are output as signals through the common amplification transistor and the like. Moreover, as shown in FIG. 13, electron signals based on the electrons e serving as signal charges are converted into digital signals by an electron AD converter 76. Hole signals based on the holes h serving as signal charges are converted into digital signals by a hole AD converter 77. The timings for extracting the electrons e and the holes h into the floating diffusions FD are synchronized taking the difference in the mobility of the holes h and the electrons into account. Thereafter, the electron and hole signals from the AD converters 76 and 77 are combined by a signal combination and processing circuit 78 and are output as processed pixel signals. The signal combination and processing circuit 78 performs luminance processing, color processing, color matrix processing, and the like.

According to the solid-state imaging device 71 according to the eighth embodiment, in one pixel, since both the electron e and hole h charges generated through photoelectric conversion are used as signal charges, it is possible to further improve sensitivity. Under the same number of pixels, the effective light collecting area becomes about 1.5 times that of the solid-state imaging device (in which color filters have the Bayer arrangement) having the silicon-based structure of the related art. Ideally, the effective light collecting area is increased by 1.5 times or more. If an organic material having quantization efficiency of 0.5 times or greater than that of silicon is used, the sensitivity is increased by 1.5 times or more, and substantially the same or superior sensitivity as the silicon-based structure can be realized. Moreover, the thicknesses d5 of the photoelectric conversion portions of all pixels can be decreased to about 0.6 µm.

In the eighth embodiment, although the semiconductor layer 12 is used for the movement of electrons and the wiring layers 73 are used for the movement of holes h, the semiconductor layer 12 may be used for the movement of holes h and the wiring layers 73 may be used for the movement of electrons. In this case, the conductivity types of the respective semiconductor regions including the organic photoelectric conversion films 13 and the semiconductor layer 12 are changed to the opposite conductivity types. In addition to the above, the same advantages as those described in relation to the basic configuration and the first embodiment are obtained.

While the present disclosure has been described by way of the solid-state imaging devices according to the first to eighth embodiments, these embodiments illustrate preferred modes of the present disclosure. The technical scope of the present disclosure is not limited to these embodiments. In the embodiments described above, although the visible light region is described, in principle, the present disclosure can be applied to solid-state imaging devices which are sensitive to other wavelength bands other than the visible light, for example, terahertz rays, infrared rays, ultraviolet rays, and X rays depending on the sensitive region of used organic materials.

<11. Ninth Embodiment>
[Exemplary Configuration of Electronic Apparatus]

The solid-state imaging devices according to the embodiments of the present disclosure can be applied to a camera system such as a digital camera or a video camera and an electronic apparatus such as a mobile phone having imaging capability or other apparatuses having imaging capability.

Figure 16:
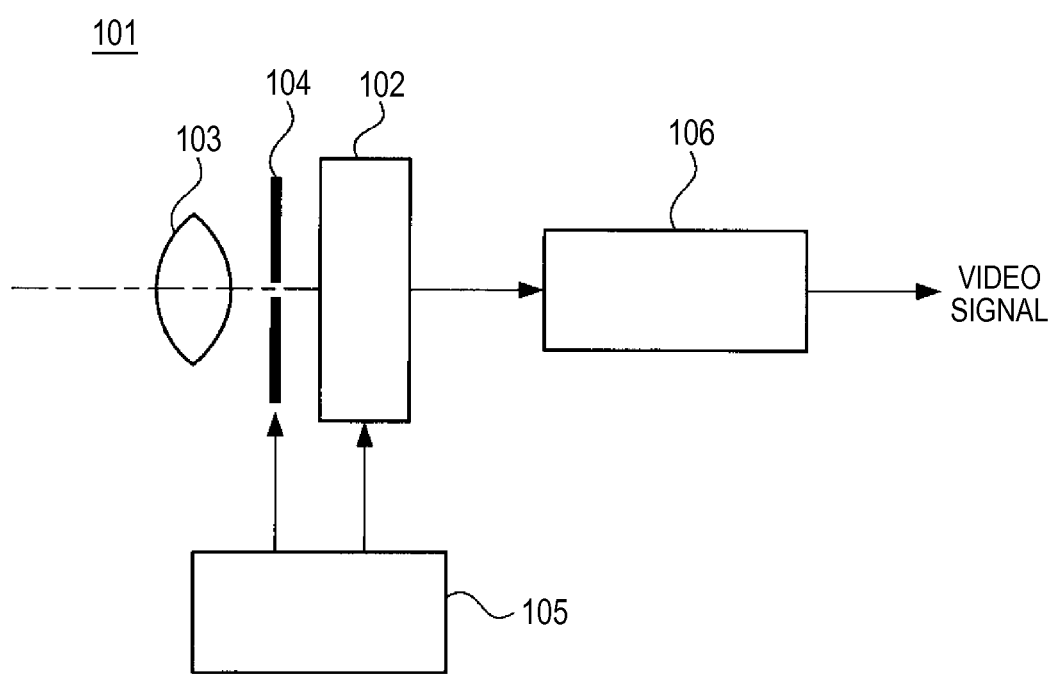
FIG. 16 is a diagram showing a simplified configuration of an electronic apparatus according to a ninth embodiment of the present disclosure.

FIG. 16 shows a camera as an example of an electronic apparatus according to a ninth embodiment of the present disclosure. The camera according to the present embodiment is an example of a video camera capable of capturing still images or movies. The camera 101 according to the present embodiment includes a solid-state imaging device 102, an optical system 103 that guides incident light to a reception sensor portion of the solid-state imaging device 102, a shutter mechanism 104, a driving circuit 105 for driving the solid-state imaging device 102, and a signal processing circuit 106 for processing the output signals of the solid-state imaging device 102.

The solid-state imaging device 102 is a solid-state imaging device according to any one of the above-described embodiments. The optical system (optical lens) 103 causes an image light (incident light) from a subject to be focused on an imaging surface of the solid-state imaging device 102. In this way, signal charges are accumulated for a predetermined period in the solid-state imaging device 102. The optical system 103 may be an optical lens system made up of a plurality of optical lenses. The shutter mechanism 104 controls the periods in which the entrance of light to the solid-state imaging device 102 is allowed or not. The driving circuit 105 supplies a driving signal for controlling the transfer operation of the solid-state imaging device 102 and the shutter operation of the shutter mechanism 104. Signals are transferred in the solid-state imaging device 102 in accordance with the driving signal (timing signal) supplied from the driving circuit 105. The signal processing circuit 106 performs various signal processing. The processed video signals are stored in a storage medium such as a memory or output to a monitor.

According to the electronic apparatus according to the ninth embodiment, since the solid-state imaging device includes pixels which include the hybrid photoelectric conversion portion made up of an organic film and a semiconductor layer, it is possible to improve sensitivity and perform fast and stable driving. Thus, it is possible to provide a high-quality electronic apparatus. For example, it is possible to provide a high-quality camera and the like.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising pixels, each pixel including a hybrid photoelectric conversion portion and pixel transistors, the hybrid photoelectric conversion portion including
    (a) a semiconductor layer having a first conductivity type region and a second conductivity type region that create a p-n junction within the semiconductor layer itself and that extends in a thickness direction,
    (b) a plurality of columnar or hollow cylindrical shaped organic material layers disposed in the semiconductor layer and extending in the thickness direction, and
    (c) a pair of electrodes including an upper electrode disposed above the semiconductor layer and the organic material layers and a lower electrode disposed below the semiconductor layer and the organic material layers.

2. The solid-state imaging device according to claim 1, wherein the pixels include blue, green, and red pixels.

3. The solid-state imaging device according to claim 1, wherein each hybrid photoelectric conversion portion includes a self-assembled molecular film at an interface between a respective organic material layer and the semiconductor layer.

4. The solid-state imaging device according to claim 1, wherein an interface between a respective organic material layer and the semiconductor layer has a concavo-convex shape, the interface extending along the thickness direction.

5. A solid-state imaging device comprising pixels, each including a hybrid photoelectric conversion portion and pixel transistors, the hybrid photoelectric conversion portion including:
    a semiconductor layer having a p-n junction,
    a plurality of columnar or hollow cylindrical shaped organic material layers disposed in the semiconductor layer, and
    a pair of electrodes including an upper electrode disposed above the semiconductor layer and the organic material layers and a lower electrode disposed below the semiconductor layer and the organic material layers,
    wherein,
        a photoelectric conversion portion of a blue sub pixel comprises the semiconductor layer having the p-n junction, and
        photoelectric conversion portions of green and red subpixels comprises the hybrid photoelectric conversion portion.

6. The solid-state imaging device according to claim 1, wherein:
    a photoelectric conversion portion of a blue subpixel comprises the semiconductor layer having the p-n junction,
    green and red subpixels comprises the hybrid photoelectric conversion portion,
    in the green and red subpixels, two kinds of organic material layers sensitive to green and red light are stacked so as to be separated in the thickness direction of the semiconductor layer, and charges generated in the two kinds of organic material layers move inside the semiconductor layer.

7. The solid-state imaging device according to claim 1, wherein:

blue, green, and red subpixels are identically configured and comprise the hybrid photoelectric conversion portion, in the blue, green and red subpixels, three kinds of organic material layers sensitive to blue, green, and red light are stacked so as to be separated in the thickness direction of the semiconductor layer, and charges generated in the three kinds of organic material layers move inside the semiconductor layer.

8. The solid-state imaging device according to claim 5, wherein in the hybrid photoelectric conversion portion, a self-assembled molecular film is formed at an interface between a respective organic material layer and the semiconductor layer.

9. The solid-state imaging device according to claim 8, wherein the interface between a respective organic material layer and the semiconductor layer has a concavo-convex shape, the interface extending along the thickness direction.

10. An electronic apparatus comprising:

a solid-state imaging device having pixels, each pixel including a hybrid photoelectric conversion portion and pixel transistors, the hybrid photoelectric conversion portion including (a) a semiconductor layer having a first conductivity type region and a second conductivity type region that create a p-n junction within the semiconductor layer itself and that extends in a thickness direction, (b) a plurality of columnar or hollow cylindrical shaped organic material layers disposed in the semiconductor layer and extending in the depth direction, and (c) a pair of electrodes including an upper electrode disposed above the semiconductor layer and the organic material layers and a lower electrode disposed below the semiconductor layer and the organic material layers;

an optical system that guides incident light to the hybrid photoelectric conversion portion of the solid-state imaging device; and a signal processing circuit that processes output signals of the solid-state imaging device.

11. The electronic apparatus of claim 10, further comprising:

an insulating film between the pixel transistors and the lower electrode.

* * * * *